(12) United States Patent
Kimura et al.

(10) Patent No.: US 9,337,858 B2
(45) Date of Patent: *May 10, 2016

(54) DATA PROCESSING SYSTEM

(71) Applicant: Renesas Electronics Corporation, Kawasaki-shi, Kanagawa (JP)

(72) Inventors: Kakeru Kimura, Tokyo (JP); Yoshimi Iso, Tokyo (JP); Masakazu Okamura, Tokyo (JP); Masashi Nishimoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/745,627

(22) Filed: Jun. 22, 2015

(65) Prior Publication Data

US 2015/0288377 A1  Oct. 8, 2015

Related U.S. Application Data

(63) Continuation of application No. 14/458,406, filed on Aug. 13, 2014, now Pat. No. 9,065,467, which is a continuation of application No. 14/113,213, filed as application No. PCT/JP2012/059758 on Apr. 10, 2012, now Pat. No. 8,860,593.

(30) Foreign Application Priority Data

Apr. 22, 2011 (JP) ................................. 2011-095819

(51) Int. Cl.
*H03M 1/10* (2006.01)
*H03M 1/18* (2006.01)
(Continued)

(52) U.S. Cl.
CPC .............. *H03M 1/183* (2013.01); *H03M 1/124* (2013.01); *H03M 1/182* (2013.01); *H03M 1/20* (2013.01)

(58) Field of Classification Search
CPC ....... H03M 1/183; H03M 1/12; H03M 1/185; H03M 1/1009; H03M 1/18; H03M 1/00; H03M 1/06; H03M 1/1071; H03M 1/182; H03M 1/20; H03M 1/56; H03M 3/354; H03M 2201/3168
USPC .................. 341/118, 120, 139, 142, 155, 158
See application file for complete search history.

(56) References Cited

U.S. PATENT DOCUMENTS 5,422,643 A * 6/1995 Chu ....................... H03M 1/187
  341/139
6,252,536 B1 * 6/2001 Johnson ................. H03M 1/187
  330/253

(Continued)

FOREIGN PATENT DOCUMENTS

CN  102422538 A   4/2012
JP  58-127429 A   7/1983

(Continued)

OTHER PUBLICATIONS

U.S. Appl. No. 14/113,213, "Data Processing"; Kimura et al. filed Oct. 21, 2013.

(Continued)

*Primary Examiner* — Linh Nguyen
(74) *Attorney, Agent, or Firm* — Shapiro, Gabor and Rosenberger, PLLC

(57) ABSTRACT

The present invention provides a data processing system which can increase resolution and which has excellent tracking with respect to the switching of a conversion range and is small in conversion error. The data processing system, which obtains an A/D conversion result after an n (where n: positive integer)-bit extension made to the resolution of an A/D converter, divides the input range of the A/D converter by m ($2^n \le m$), determines to which divided range the A/D conversion result by the A/D converter belongs with respect to an analog signal to be measured, amplifies an amp offset which defines the range of the determined divided range as a voltage range for the input range of the A/D converter by applying the amp offset to a programmable gain amplifier, converts the amplified signal by the A/D converter, and adds a corresponding digital offset to a result of execution of a lower side bit extension to the conversion result and a division thereof by actually measured gain of the programmable gain amplifier, whereby an A/D conversion result with a bit precision being n-bit extended is obtained.

9 Claims, 28 Drawing Sheets

(51) Int. Cl.
  *H03M 1/20* (2006.01)
  *H03M 1/12* (2006.01)

(56) References Cited

U.S. PATENT DOCUMENTS

| | | | |
|---|---|---|---|
| 6,720,902 B2 | 4/2004 | Stimmann | |
| 6,791,484 B1 * | 9/2004 | Lee | H03M 1/1019 341/110 |
| 7,085,328 B2 * | 8/2006 | Lin | H04L 27/34 375/261 |
| 7,215,266 B2 | 5/2007 | Li et al. | |
| 7,405,683 B1 * | 7/2008 | Perrin | H03M 1/185 341/139 |
| 7,643,573 B2 * | 1/2010 | Kejariwal | H03F 3/45188 330/278 |
| 7,649,480 B2 * | 1/2010 | Boomer | H03M 1/1023 341/118 |
| 8,077,065 B2 | 12/2011 | Iso et al. | |
| 8,547,256 B2 * | 10/2013 | Kurachi | H03M 1/1028 341/118 |
| 8,614,635 B2 | 12/2013 | Hode | |
| 8,686,885 B2 | 4/2014 | Matsuura et al. | |
| 8,860,593 B2 * | 10/2014 | Kimura | H03M 1/182 341/118 |
| 2002/0196717 A1 * | 12/2002 | Masui | G11B 7/07 369/44.29 |
| 2003/0102994 A1 | 6/2003 | Stimminn | |
| 2005/0024249 A1 | 2/2005 | Pavicic | |
| 2005/0258989 A1 | 11/2005 | Li et al. | |
| 2006/0084402 A1 * | 4/2006 | Oshima | H04B 1/1027 455/232.1 |
| 2007/0013565 A1 | 1/2007 | Huang | |
| 2008/0018508 A1 | 1/2008 | Filipovic et al. | |
| 2008/0129563 A1 | 6/2008 | Boomer et al. | |
| 2012/0032825 A1 | 2/2012 | Hode | |

FOREIGN PATENT DOCUMENTS

| | | |
|---|---|---|
| JP | 04-370801 A | 12/1992 |
| JP | 05-14201 A | 1/1993 |
| JP | 06-334523 A | 12/1994 |
| TW | I250749 B | 3/2006 |
| TW | 200704154 A | 1/2007 |
| TW | 200830727 A | 7/2008 |

OTHER PUBLICATIONS

Office Action issued Nov. 24, 2015, in Chinese Patent Application No. 201280019587.X.

* cited by examiner

Fig.27
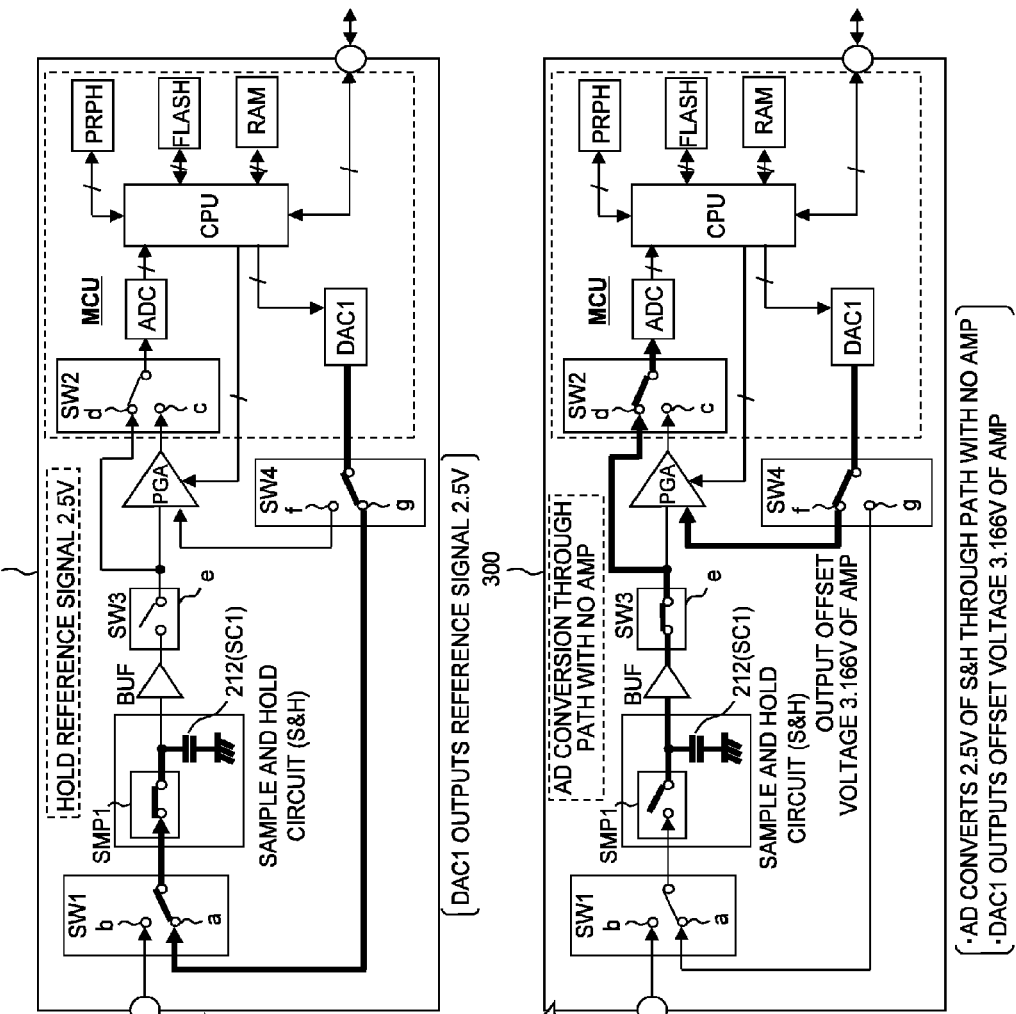
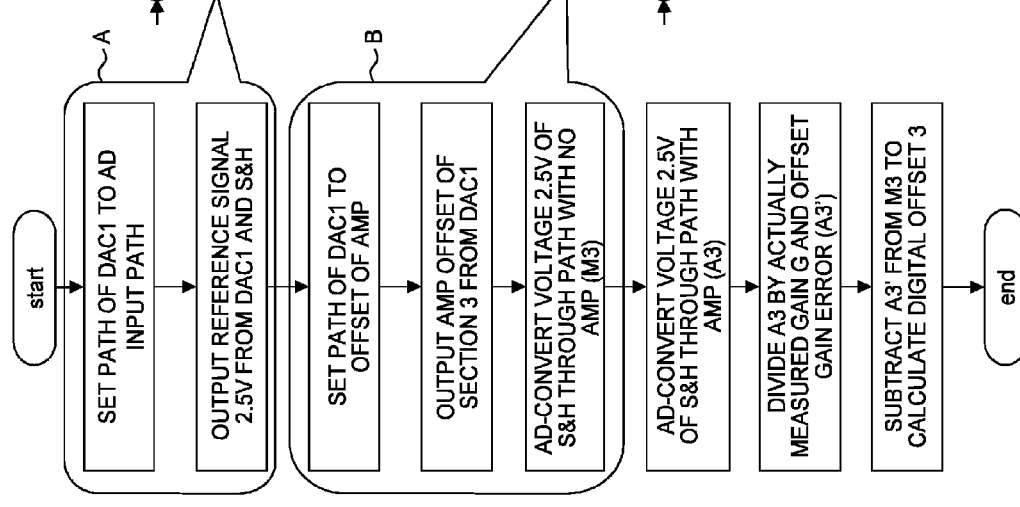

DATA PROCESSING SYSTEM

TECHNICAL FIELD

The present invention relates to a data processing system having an AD (Analog to Digital) conversion function, and particularly to a technology for obtaining a bit precision (resolution) higher than a bit precision of an AD converter.

BACKGROUND ART

There is, in a Patent Document 1, a description of a technique intended to realize high precision AD conversion by adding a ramp voltage having amplitude substantially equal to the minimum resolution of an AD converter circuit, performing an AD conversion operation plural times and averaging respective digital outputs by an arithmetic circuit having a larger number of digits than the number of digits of the AD converter.

In a Patent Document 2, a differential amplifier obtains the difference between an input analog signal and a reference signal corresponding to a conversion range, and an AD converter converts the difference into a digital signal. A control device that receives the digital signal therein controls the reference signal in response to a digital signal corresponding to the difference and generates an output digital signal in response to the digital signal and the conversion range. A resolution of conversion-range several times that of an actual AD converter can be obtained and a required resolution is obtained by way of setting the conversion range.

RELATED ART DOCUMENT

Patent Documents

[Patent Document 1] Japanese Unexamined Patent Publication No. Hei 5 (1993)-14201
[Patent Document 2] Japanese Unexamined Patent Publication No. Hei 6 (1994)-334523

DISCLOSURE OF THE INVENTION

Problems that the Invention is to Solve

The present inventors have studied to increase the resolution of the AD converter over the entire conversion range of the AD converter. It is not easy to achieve its purpose in the Patent Document 1. The Patent Document 2 is intended to increase a conversion bit precision by amplifying by the AD converter, a difference between the reference signal for the conversion range and the input signal to be measured. However, in order to optimally switch the conversion range in accordance with the measured signal, it should be necessary to perform switching of the reference signal by performing determination as to whether an AD conversion result shakes off the conversion range, and tracking for the switching of the conversion range is considered to be poor. The continuity of converted data between the conversion ranges at the time that the conversion range is switched has not been studied either. Further, the relationship between the amplification factor of the differential amplifier and expanded resolution has not been manifested either. In addition, various studies are considered to be necessary.

An object of the present invention is to provide a data processing system which is capable of increasing the resolution of an AD converter over the entire conversion range thereof and which is satisfactory in tracking with respect to the switching of the conversion range and small in conversion error.

The above, other objects and novel features of the present invention will become apparent from the description of the present specification and the accompanying drawings.

Means for Solving the Problems

A summary of a representative one of the inventions disclosed in the present application will be explained in brief as follows:

A data processing system that obtains an AD conversion result in which a bit precision is n-bit extended (where n: positive integer) with respect to the resolution of an AD converter, divides an input range of the AD converter by m ($2^m \leq m$), calculates a digital offset at which voltages at connection points of respective divided ranges are identical between the adjacent divided ranges, determines to which divided range an AD conversion result by the AD converter belongs with respect to an analog signal to be measured, amplifies an amp offset which defines the range for each determined divided range as a voltage range for the input range of the AD converter by applying the amp offset to the programmable gain amplifier, converts the amplified signal by the AD converter, adds a corresponding digital offset of divided range to a result obtained by performing a lower n-bit extension to its conversion result and division of the extended value by actually measured gain of the programmable gain amplifier, thereby obtaining an AD conversion result with a bit precision being n-bit extended.

Effects of the Invention

Advantageous effects obtained by a typical one of the inventions disclosed in the present application will be explained in brief as follows:

It is possible to increase the resolution of an AD converter over the entire conversion range of the AD converter and to make satisfactory tracking with respect to the switching of a conversion range and reduce a conversion error thereof.

BRIEF DESCRIPTION OF THE DRAWINGS

FIG. 27 is an operation explanatory diagram illustrating the details of portions A and B in the flowchart at the calculation of a digital offset of a section 3.

BEST MODE FOR CARRYING OUT THE INVENTION

1. Summary of the Embodiments

Figure 1:
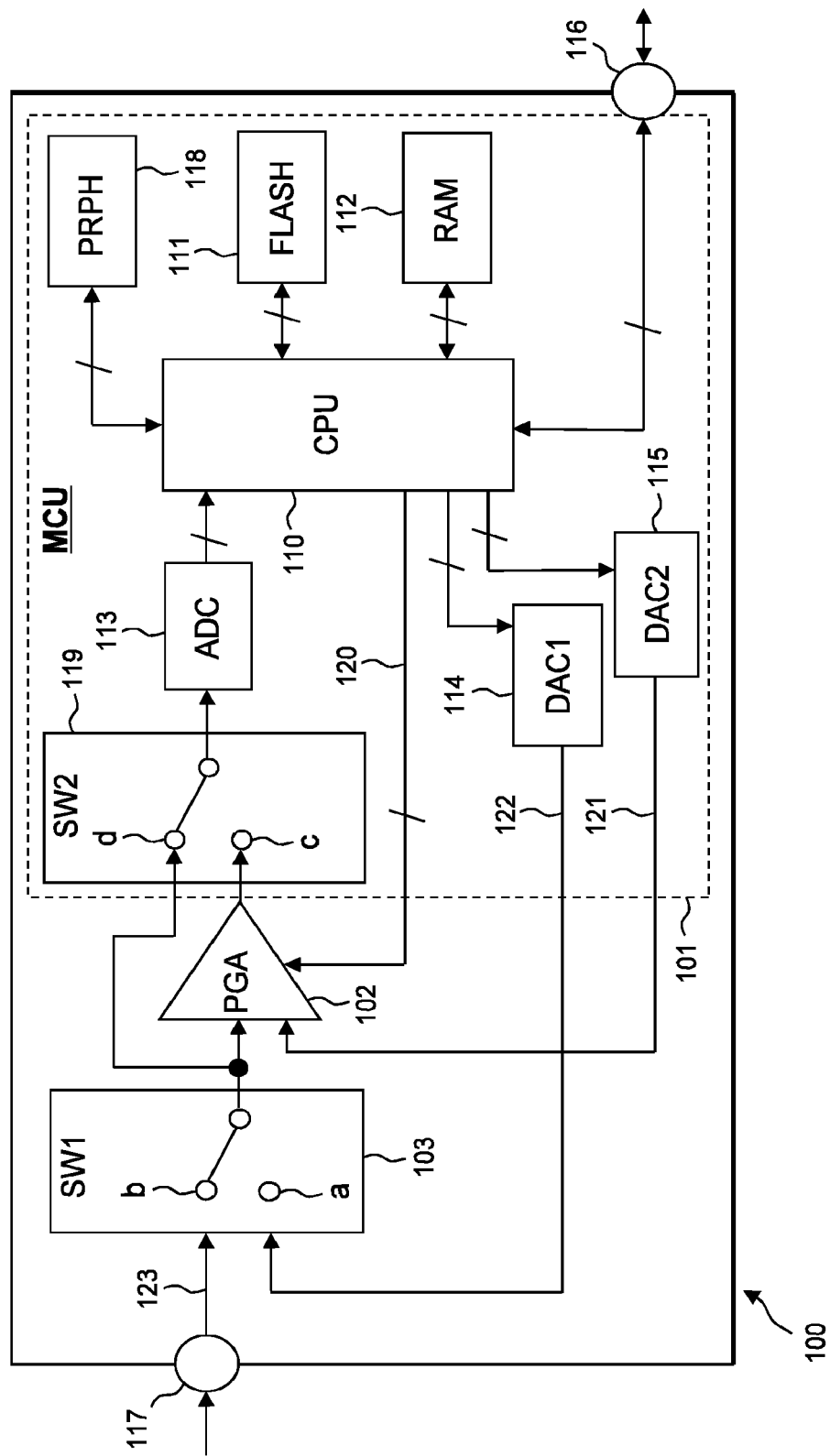
FIG. 1 is a block diagram illustrating a data processing system according to a first embodiment of the present invention.

A summary of typical embodiments of the invention disclosed in the present application will first be explained. Reference numerals of the accompanying drawings referred to with parentheses in the description of the summary of the typical embodiments merely illustrate what included in the concept of components to which the reference numerals are given.

[1] <Amplification of Input, AD Conversion and Bit Extension are Performed for Each Divided Input Range of ADC>

A data processing system (100, 200 and 300) according to a typical embodiment of the present invention is a system that obtains an AD conversion result in which n (where n: positive integer) bit extension is performed on the resolution of an AD converter. The system has the AD converter (113), a programmable gain amplifier (102) and a control circuit (110, 110A, and 110B). The control circuit divides an input range of the AD converter by m ($2^n \leq m$), prepares a digital offset at which voltages at connection points of respective divided ranges are identical between the adjacent divided ranges, determines to which divided range an AD conversion result by the AD converter belongs with respect to an analog signal to be measured, amplifies an amp offset which defines a voltage range for each determined divided range as a voltage range for the input range of the AD converter by applying the amp offset and a designation of gain therefor to the programmable gain amplifier, converts the amplified signal by the AD converter, performs an n-bit extension and a division by the value of actually measured gain of the programmable gain amplifier on a result of conversion thereof, and adds a corresponding digital offset of divided range to the conversion result, thereby obtaining an AD conversion result with a bit precision being n-bit extended.

Thus, it is possible to finally obtain an AD conversion result having n-bit extended a bit precision in a range to satisfy the relationship of $2^n \leq m$, depending on a division number m for the input range of an AD converter. At this time, the amplification is performed by applying designation of an amp offset and gain for defining the range for each determined divided range as a voltage range for the input range of the AD converter to a programmable gain amplifier. Therefore, the programmable gain amplifier performs the amplification at gain $2^n$ or in the vicinity thereof. At this time, the calibration for a gain error of the programmable gain amplifier is carried out by performing the amplification of the input, AD conversion and an n-bit extension for each divided input range of the AD converter. Further, a digital offset that gives the minimum value of the divided range is identical to the maximum value of the divided range adjacent to its lower order. It is therefore possible to achieve a high conversion precision small in conversion error for the AD conversion result of the high resolution over the entire conversion range of the AD converter. Furthermore, since the above determination may be performed by performing AD conversion once by the AD converter without amplification by the programmable gain amplifier even in selecting the conversion range, good tracking can be obtained upon switching the conversion range.

[2] <Acquisition of Gain Error>

The data processing system as described above in [1], wherein the gain applied from the control circuit to the programmable gain amplifier is target gain $2^n$. The n-bit extension by the control circuit is a 0 extension to the lower bit of the AD conversion result.

It is thus possible to easily offset a gain error of the programmable gain amplifier.

[3] <Acquisition of Actually Measured Gain>

The data processing system as described above in [2], wherein the control circuit sets the $2^n$ to the programmable gain amplifier as target gain and obtains actually measured gain for the target gain, based on a difference between a digital value obtained by converting the output of the analog signal amplified by the programmable gain amplifier by the AD converter and a digital value used to generate the analog signal supplied to the programmable gain amplifier at that time.

It is thus possible to easily obtain actually measured gain of the programmable gain amplifier, which is used to offset an amplification error caused by the programmable gain amplifier.

[4] <Crossing Boundary Portions Between Adjacent Divided Ranges>

The data processing system as described above in [1], wherein the control circuit sets the amp offset so as to cross boundary portions between the adjacent divided ranges.

Thus, it is possible to avoid using an amplification function for an input near the minimum and maximum inputs hard to ensure the linearity according to the amplification characteristics of the programmable gain amplifier, thus making it possible to contribute to a reduction in AD conversion error at this point.

[5] <Determination of Divided Ranges that Belong>

The data processing system as described above in [1], wherein the control circuit determines an input range to which a voltage to be measured belongs, on the basis of AD-converted data to the input voltage, of the boundary voltage between each divided range of the AD converter.

It is thus possible to easily determine a divided range to which a signal to be measured belongs.

[6] <Sample and Hold>

The data processing system as described above in [1], wherein it further has a sample and hold circuit which inputs the measured analog signal therein. The control circuit (110A and 110B) performs determination as to each divided range and AD conversion which defines the voltage range for the determined divided range as the voltage range for the input range of the AD converter, using the same measured analog signal sampled by the sample and hold circuit.

Thus, since it is possible to perform the determination as to the divided range and the AD conversion using the result of determination thereof on the same measured analog signal, it is possible to prevent occurrence of a situation in which AD conversion is accidentally performed using different divided ranges, before it happens.

[7] <Setting the Number of Divisions of Input Range to Odd Number>

The data processing system as described above in [1], wherein the control circuit performs the process for the AD conversion by setting the number of divisions of the input range of the AD converter to an odd number when the central value of the measured analog signal is close to the central value of the input range of the AD converter.

Thus, it is possible to prevent the central value of the measured analog signal from being close to the boundary between the divided ranges. When it becomes close to the boundary between the divided ranges, the process of changing the divided range each time the measured analog signal changes beyond its central value must be carried out. Thus, the efficiency of the AD conversion process is degraded.

[8] <Individualization of DAC for Amp Offset Generation and Amp Input Signal Generation>

The data processing system as described above in [1], wherein it separately includes a DA converter (115) which outputs the amp offset to the programmable gain amplifier and a DA converter (114) which selectively outputs a setting analog signal to the programmable gain amplifier.

Thus, the setting of the amp offset and the generation of the setting analog signal can be performed in parallel, thus making it possible to contribute to an improvement in processing efficiency at the time that a digital offset is obtained.

[9] <Standardization of DAC for Amp Offset Generation and Amp Input Signal Generation>

The data processing system as described above in [1], wherein it includes a sample and hold circuit (201) which selectively samples and holds a setting analog signal instead of the measured analog signal and outputs the same to the programmable gain amplifier, a DA converter (114 of FIG. 21) shared for the generation of the amp offset and the generation of the setting analog signal, and a selection circuit (220) which selects a path to output the amp offset generated by the DA converter to the programmable gain amplifier or a path to supply the setting analog signal generated by the DA converter to the sample and hold circuit.

Thus, although the setting of the amp offset and the generation of the setting analog signal must be performed in series form, it is possible to contribute to a reduction in circuit scale by sharing of the DA converter.

[10] <Amplification of Input, AD Conversion, Bit Extension and Division by Actually Measured Gain are Performed for Each Divided Input Range of ADC>

A data processing system (100, 200 and 300) according to another embodiment of the present invention has an AD converter (113), a programmable gain amplifier (102), and a control circuit (110, 110A and 110B). The control circuit determines whether an analog signal to be measured belongs to any of divided ranges obtained by dividing an input range of the AD converter by m (where m: positive integer), sets an amp offset and target gain $2^n$ (where n: positive integer and $2^n \le m$) for expanding a voltage range for the determined divided range to a voltage range for the input range of the AD converter to the programmable gain amplifier, converts an amplified signal of the measured analog signal by the programmable gain by the AD converter, performs a bit extension of n bits for the converted data and a division of the extended data by actually measured gain of the programmable gain amplifier, and adds digital offset data of the divided range appropriate to the corresponding divided range to a result of division thereof, thereby obtaining an AD conversion result in which a bit precision has been n-bit extended.

Thus, it is possible to finally obtain an AD conversion result having n-bit extended a bit precision in a range to satisfy the relationship of $2^n \le m$, depending on a division number m for the input range of the AD converter. At this time, the amplification is performed by applying designation of an amp offset and gain for defining the range for each determined divided range as a voltage range for the input range of the AD converter to the programmable gain amplifier. Therefore, the programmable gain amplifier performs the amplification at gain $2^n$ or in the vicinity thereof. At this time, the calibration for a gain error of the programmable gain amplifier is carried out by performing the amplification of the input, AD conversion, an n-bit extension and division by actually measured gain of the programmable gain amplifier for each divided input range of the AD converter. Accordingly, the gain error of the programmable gain amplifier is offset over the entire conversion range of the AD converter, and an AD conversion result in which a bit precision has been n-bit extended can be obtained. Further, since the above determination may be performed by performing AD conversion once by the AD converter without amplification by the programmable gain amplifier even in selecting the conversion range, satisfactory tracking can be obtained even upon switching the conversion range.

[11] <Generation of Digital Offset Data of Section Serving as Reference>

The data processing system as described above in [10] has a first DA converter (114) and a second DA converter (115). The control circuit controls first through fifth processes. The first process is a process of acquiring first data by generating an arbitrary voltage of specific the divided range by the first DA converter and converting the same by the AD converter. The second process is a process of acquiring second data by performing a bit extension of n bits on the lower side of the first data depending on the corresponding divided range. The third process is a process of acquiring third data by generating an arbitrary voltage of the specific divided range by the first DA converter and generating an amp offset for expanding the voltage range for the corresponding divided range to the voltage range for the input range of the AD converter by the second DA converter and by amplifying the arbitrary voltage generated by the first DA converter by the programmable gain amplifier to which the generated amp offset and the target gain $2^n$ have been set, and converting the amplified signal by the AD converter. The fourth process is a process of acquiring fourth data by n-bit extending the third data to the lower side and dividing the extended data by the actually measured gain. The fifth process is a process of acquiring digital offset data of the specific divided range by subtracting the fourth data from the second data.

Thus, in the voltage range for the specific divided range, a value obtained by adding the digital offset data to a value obtained by n-bit extending a result of AD conversion of the voltage range for the input range amplified by the programmable gain amplifier and dividing the same by the actually measured gain, and a value AD-converted directly without via the programmable gain amplifier substantially coincide with each other.

[12] <Generation of Upper Digital Offset Data of Digital Offset Data Known Section>

The data processing system as described above in [11], wherein when the digital offset data of the specific divided range is generated and thereafter digital offset data of the divided range of the upper side of the corresponding divided range is generated, the control circuit controls sixth through ninth processes. The sixth process is a process of acquiring sixth data by generating the maximum voltage of the specific divided range by the first DA converter and generating by the second DA converter, an amp offset for expanding the voltage range for the corresponding divided range to the voltage range for the input range of the AD converter, and by amplifying the maximum voltage generated by the first DA converter by the programmable gain amplifier to which the generated amp offset and the target gain $2^n$ have been set, and converting the amplified signal by the AD converter. The seventh process is a process of acquiring seventh data by n-bit extending the sixth data to the lower side and dividing the extended data by the actually measured gain, and adding the digital offset data of the specific divided range to a result of division thereof. The eighth process is a process of acquiring eighth data by generating the minimum voltage of the upper divided range by the first DA converter and generating by the second DA converter, an amp offset for expanding the voltage range for the corresponding divided range to the voltage range for the input range of the AD converter, and by amplifying the minimum voltage generated by the first DA converter by the programmable gain amplifier to which the generated amp offset and the target gain $2^n$ have been set, and converting the amplified signal by the AD converter. The ninth process is a process of n-bit extending the eighth data to the lower side and dividing the extended data by the actually measured gain, and subtracting a result of division thereof from the seventh data to define the resultant data as digital offset data of the upper divided range.

Thus, since the voltages at the points of connection of the specific divided range having determined the known digital offset data and the upper divided range adjacent to the specific divided range are computed using the known digital offset data so as to coincide with each other in both divided ranges, it is possible to ensure continuity between the specific divided range and the upper divided range adjacent thereto. Further, in the voltage range for the corresponding divided range, a value obtained by adding the digital offset data to a value obtained by n-bit extending a result of AD conversion of the voltage range for the input range amplified by the programmable gain amplifier and dividing the same by the actually measured gain, and a value AD-converted directly without via the programmable gain amplifier substantially coincide with each other. In particular, since the bit extension of n bits and the division thereof by the actually measured gain are performed on the AD-converted values in the respective divided ranges, it is possible to eliminate the influence of a gain error of the programmable gain amplifier and to guarantee the continuity thereof with a high degree of accuracy.

[13] <Generation of Lower Digital Offset Data of Digital Offset Data Known Section>

The data processing system as described above in [11], wherein the control circuit performs tenth through thirteenth processes when the digital offset data of the specific divided range is generated and thereafter digital offset data of the divided range of the lower side of the corresponding divided range is generated. The tenth process is a process of acquiring tenth data by generating the minimum voltage of the specific divided range by the first DA converter and generating by the second DA converter, an amp offset for expanding the voltage range for the corresponding divided range to the voltage range for the input range of the AD converter, and by amplifying the minimum voltage generated by the first DA converter by the programmable gain amplifier to which the generated amp offset and the target gain $2^n$ have been set, and converting the amplified signal by the AD converter. The eleventh process is a process of acquiring eleventh data by n-bit extending the tenth data to the lower side, dividing the extended data by the actually measured gain, and adding the digital offset data of the specific divided range to a result of division thereof. The twelfth process is a process of acquiring twelfth data by generating the maximum voltage of the divided range of the lower side by the first DA converter and generating by the second DA converter, an amp offset for expanding the voltage range for the corresponding divided range to the voltage range for the input range of the AD converter, and by amplifying the maximum voltage generated by the first DA converter by the programmable gain amplifier to which the generated amp offset and target gain $2^n$ have been set, and converting the amplified signal by the AD converter. The thirteenth process is a process of n-bit extending the twelfth data to the lower side, dividing the extended data by the actually measured gain, and subtracting a result of division thereof from the eleventh data to define the resultant data as the digital offset data of the lower divided range.

Thus, since the voltages at the points of connection of the specific divided range having determined the known digital offset data and the lower divided range adjacent to the specific divided range are computed using the known reference digital offset data so as to coincide with each other in both divided ranges, it is possible to ensure continuity between the specific divided range and the lower divided range adjacent thereto. Further, in the voltage range for the corresponding divided range, a value obtained by adding the digital offset data to a value obtained by n-bit extending a result of AD conversion of the voltage range for the input range amplified by the programmable gain amplifier and dividing the same by the actually measured gain, and a value AD-converted directly without via the programmable gain amplifier substantially coincide with each other. In particular, since the bit extension of n bits and the division thereof by the actually measured gain are performed on the AD-converted values in the respective divided ranges, it is possible to eliminate the effect of a gain error of the programmable gain amplifier and to guarantee the continuity thereof with a high degree of accuracy.

[14] <Crossing Boundary Portions Between Adjacent Divided Ranges>

The data processing system as described above in [10], wherein the control circuit sets the amp offset so as to cross boundary portions between the adjacent divided ranges.

Thus, it is possible to avoid using an amplification function for an input near the minimum and maximum inputs hard to ensure the linearity according to the amplification characteristics of the programmable gain amplifier, thus making it possible to contribute to a reduction in AD conversion error at this point.

[15] <Sample and Hold>

The data processing system as described above in [10], wherein it further includes a sample and hold circuit (201) which inputs the measured analog signal therein. The control circuit (110A and 110B) performs determination as to each divided range and AD conversion that defines the voltage range for the determined divided range as the voltage range for the input range of the AD converter, using the same measured analog signal sampled by the sample and hold circuit.

Thus, since it is possible to perform the determination as to the divided range and the AD conversion defining the voltage range for the determined divided range as the voltage range for the input range of the AD converter on the same measured analog signal, it is possible to prevent occurrence of a situation in which AD conversion is accidentally performed using different divided ranges, before it happens.

[16] <Setting Number of Divisions of Input Range to Odd Number>

The data processing system as described above in [10], wherein the control circuit performs the process for AD conversion by setting the number of divisions of the input range of the AD converter to an odd number when the central value of the measured analog signal is close to the central value of the input range of the AD converter.

Thus, it is possible to prevent the central value of the measured analog signal from being close to the boundary between the divided ranges. When it becomes close to the boundary between the divided ranges, the process of changing the divided range each time the measured analog signal changes beyond its central value must be carried out, thus causing degradation in the efficiency of the AD conversion process.

[17] <Individualization of DAC for Amp Offset Generation and Amp Input Signal Generation>

The data processing system as described above in [10], wherein it separately has a DA converter (115) which outputs the amp offset to the programmable gain amplifier and a DA converter (114) which selectively outputs a setting analog signal to the programmable gain amplifier.

Thus, the setting of the amp offset and the generation of the setting analog signal can be performed in parallel, thus making it possible to contribute to an improvement in processing efficiency at the time that a digital offset is obtained.

[18] <Commonality of DAC for Amp Offset Generation and Amp Input Signal Generation>

The data processing system as described above in [10], wherein it has a sample and hold circuit (201) which selectively samples and holds a setting analog signal instead of the measured analog signal and outputs the same to the programmable gain amplifier, a DA converter (114 of FIG. 21) shared for the generation of the amp offset and the generation of the setting analog signal, and a selection circuit which selects a path to output the amp offset generated by the DA converter to the programmable gain amplifier or a path to supply the setting analog signal generated by the DA converter to the sample and hold circuit.

Thus, although the setting of the amp offset and the generation of the setting analog signal must be performed in series form, it is possible to contribute to a reduction in circuit scale by sharing of the DA converter.

[19] <Amplification of Input, AD Conversion, Bit Extension and Division by Actually Measured Gain are Performed for Each Divided Input Range of ADC>

A data processing system (100, 200 and 300) according to a further embodiment of the present invention has an AD converter (113), a programmable gain amplifier (102), a DA converter (114 and 115), and a control circuit (110, 110A and 110B) which performs a gain calibration process of the programmable gain amplifier, a generation process of digital offset data, a determination process of an input section for an analog signal to be measured, and an extended AD conversion process that defines the section determined for the measured analog signal as a voltage range for an input range of the AD converter. The determination process of the input section is a process of determining whether a conversion result for the measured analog signal by the AD converter belongs to any of divided ranges obtained by dividing the voltage range for the input range of the AD converter by m (positive integer). The extended AD conversion process is defined as an AD conversion result obtained by setting an amp offset and target gain $2^n$ (where n: positive integer and $2^n \le m$) for expanding the voltage range for the determined divided range to the voltage range for the input range of the AD converter to the programmable gain amplifier, converting an amplified signal of the measured analog signal by the so-set programmable gain amplifier by the AD converter, performing a bit extension of n bits on the converted digital data and division of the extended data by actually measured gain of the programmable gain amplifier, and adding the digital offset data corresponding to the minimum value of the determined divided range to the divided data to n-bit extend a bit precision.

Thus, it is possible to finally obtain an AD conversion result having n-bit extended a bit precision in a range to satisfy the relationship of $2^n \le m$, depending on a division number m for the input range of the AD converter. At this time, the amplification is performed by applying designation of an amp offset and gain for defining the range for each determined divided range as a voltage range for the input range of the AD converter to the programmable gain amplifier. Therefore, the programmable gain amplifier performs the amplification at gain $2^n$ or in the vicinity thereof. At this time, the calibration for a gain error of the programmable gain amplifier is carried out by performing the amplification of the input, AD conversion, an n-bit extension and division by actually measured gain of the programmable gain amplifier for each divided input range of the AD converter. Further, a digital offset that applies the minimum value of each divided range is identical to the maximum value of a divided range adjacent to its lower order. It is thus possible to realize high conversion accuracy small in conversion error with respect to an AD conversion result of high resolution over the entire conversion range of the AD converter. Further, since the above determination may be carried out by performing AD conversion once by the AD converter without amplification by the programmable gain amplifier even in selecting the conversion range, satisfactory tracking is obtained even upon switching the conversion range.

[20] <Generation of Digital Offset Data of Section Serving as Reference>

The data processing system as described above in [19], wherein it has a first DA converter (114) and a second DA converter (115) each serving as the DA converter. The generation process of the digital offset data includes first through fifth processes. The first process is a process of acquiring first data by generating an arbitrary voltage of specific the divided range by the first DA converter and converting the same by the AD converter. The second process is a process of acquiring second data by performing a bit extension of n bits on the lower side of the first data. The third process is a process of acquiring third data by generating an arbitrary voltage of the specific divided range by the first DA converter and generating by the second DA converter, an amp offset for expanding the voltage range for the corresponding divided range to the voltage range for the input range of the AD converter and by amplifying the arbitrary voltage generated by the first DA converter by the programmable gain amplifier to which the generated amp offset and the target gain $2^n$ have been set, and converting the amplified signal by the AD converter. The fourth process is a process of acquiring fourth data by n-bit extending the third data to the lower side and dividing the extended data by the actually measured gain. The fifth process is a process of acquiring the digital offset data of the specific divided range by subtracting the fourth data from the second data.

Thus, in the voltage range for the specific divided range, a value obtained by adding the digital offset data to a value obtained by n-bit extending a result of AD conversion of the voltage range for the input range amplified by the programmable gain amplifier and dividing the same by the actually measured gain, and a value AD-converted directly without via the programmable gain amplifier substantially coincide with each other.

[21] <Generation of Upper Digital Offset Data of Digital Offset Data Known Section>

The data processing system as described above in [20], wherein the generation process of the digital offset data includes six through ninth processes in order to generate digital offset data of the divided range of the upper side of the corresponding divided range after the generation of the digital offset data of the specific divided range. The sixth process is a process of acquiring sixth data by generating the maximum voltage of the specific divided range by the first DA converter and generating by the second DA converter, an amp offset for expanding the voltage range for the corresponding divided range to the voltage range for the input range of the AD converter and by amplifying the maximum voltage generated by the first DA converter by the programmable gain amplifier to which the generated amp offset and the target gain $2^n$ have been set and converting the amplified signal by the AD converter. The seventh process is a process of acquiring seventh data by n-bit extending the sixth data to the lower side and dividing the extended data by the actually measured gain, and adding the digital offset data to a result of division thereof. The eighth process is a process of acquiring eighth data by generating the minimum voltage of the divided range of the upper side by the first DA converter and generating by the second DA converter, an amp offset for expanding the voltage range for the corresponding divided range to the voltage range for the input range of the AD converter and by amplifying the minimum voltage generated by the first DA converter by the programmable gain amplifier to which the generated amp offset and the target gain $2^n$ have been set and converting the amplified signal by the AD converter. The ninth process is a process of n-bit extending the eighth data to the lower side and dividing the extended data by the actually measured gain, and subtracting a result of division thereof from the seventh data to define the resultant data as the digital offset data of the upper divided range.

Thus, since the voltages at the points of connection of the specific divided range having determined the known digital offset data and the upper divided range adjacent to the specific divided range are computed using the known digital offset data so as to coincide with each other in both divided ranges, it is possible to ensure continuity between the specific divided range and the upper divided range adjacent thereto. Further, in the voltage range for the corresponding divided range, a value obtained by adding the digital offset data to a value obtained by n-bit extending a result of AD conversion of the voltage range for the input range amplified by the programmable gain amplifier and dividing the same by the actually measured gain, and a value AD-converted directly without via the programmable gain amplifier substantially coincide with each other. In particular, since the bit extension of n bits and the division thereof by the actually measured gain are performed on the AD-converted values in the respective divided ranges, it is possible to eliminate the effect of a gain error of the programmable gain amplifier from the digital offset data and to guarantee the continuity thereof with a high degree of accuracy.

[22] <Generation of Lower Digital Offset Data of Digital Offset Data Known Section>

The data processing system as described above in [20], wherein the generation process of the digital offset data includes tenth through thirteenth processes in order to generate digital offset data of the divided range of the lower side of the corresponding divided range after the generation of the digital offset data of the specific divided range. The tenth process is a process of acquiring tenth data by generating the minimum voltage of the specific divided range by the first DA converter and generating by the second DA converter, an amp offset for expanding the voltage range for the corresponding divided range to the voltage range for the input range of the AD converter and by amplifying the minimum voltage generated by the first DA converter by the programmable gain amplifier to which the generated amp offset and the target gain $2^n$ have been set and converting the amplified signal by the AD converter. The eleventh process is a process of acquiring eleventh data by n-bit extending the tenth data to the lower side, dividing the extended data by the actually measured gain, and adding the reference digital offset data to a result of division thereof. The twelfth process is a process of acquiring twelfth data by generating the maximum voltage of the lower divided range by the first DA converter and generating by the second DA converter, an amp offset for expanding the voltage range for the corresponding divided range to the voltage range for the input range of the AD converter and by amplifying the maximum voltage generated by the first DA converter by the programmable gain amplifier to which the generated amp offset and the target gain $2^n$ have been set and converting the amplified signal by the AD converter. The thirteenth process is a process of n-bit extending the twelfth data to the lower side, dividing the extended data by the actually measured gain and subtracting a result of division thereof from the eleventh data to define the resultant data as the digital offset data of the lower divided range.

Thus, since the voltages at the points of connection of the specific divided range having determined the known digital offset data and the lower divided range adjacent to the specific divided range are computed using the known digital offset data so as to coincide with each other in both divided ranges, it is possible to ensure continuity between the specific divided range and the lower divided range adjacent thereto. Further, in the voltage range for the corresponding divided range, a value obtained by adding the digital offset data to a value obtained by n-bit extending a result of AD conversion of the voltage range for the input range amplified by the programmable gain amplifier and dividing the same by the actually measured gain, and a value AD-converted directly without via the programmable gain amplifier substantially coincide with each other. In particular, since the bit extension of n bits and the division thereof by the actually measured gain are performed on the AD-converted values in the respective divided ranges, it is possible to eliminate the effect of a gain error of the programmable gain amplifier from the digital offset data and to guarantee the continuity thereof with a high degree of accuracy.

[23] <Crossing Boundary Portions Between Adjacent Divided Ranges>

The data processing system as described above in [19], wherein in the extended AD conversion process, the amp offset for expanding the voltage range for the determined divided range to the voltage range for the input range of the AD converter is set so as to cross boundary portions between the adjacent divided ranges when the amp offset is set to the programmable gain amplifier.

Thus, it is possible to avoid using an amplification function for an input near the minimum and maximum inputs hard to ensure the linearity according to the amplification characteristics of the programmable gain amplifier, thus making it possible to contribute to a reduction in AD conversion error at this point.

[24] <Acquisition of Actually Measured Gain>

The data processing system as described above in [19], wherein the gain calibration process includes a process of calculating and acquiring the gain of the amplifier circuit on the basis of data obtained by amplifying an analog signal output from the first DA converter by the programmable gain amplifier and converting the same by the AD converter and data obtained by converting the analog signal by the AD converter without amplifying the same by the programmable gain amplifier.

It is thus possible to easily obtain actually measured gain used to offset an amplification error caused by the programmable gain amplifier.

[25] <Determination of Divided Range that Belongs>

The data processing system as described above in [19], wherein the section determination process includes a process of determining an input range to which a voltage to be measured belongs, based on AD-converted data for the input voltage, of the boundary voltage between each divided range of the AD converter.

It is thus possible to easily determine a divided range to which a signal to be measured belongs.

2. Further Detailed Description of the Embodiments

Embodiments will be described in further detail.

<<First Embodiment>>

A data processing system according to a first embodiment of the present invention is illustrated in FIG. 1. Although not limited in particular, it is configured as a system-on-chip type semiconductor device formed in a single semiconductor substrate such as single crystal silicon or the like by a complementary MOS integrated circuit manufacturing technology or the like. The data processing system 100 has a microcomputer (MCU) 101, a programmable gain amplifier (PGA) 102 and a selector (SW1) 103 which are representatively shown. Although not shown in the figure in particular, it is needless to say that other circuits such as a memory, an accelerator and the like may be integrated.

Although not limited in particular, the microcomputer 101 is equipped with a central processing unit (CPU) 110 that executes a program as a control circuit, a non-volatile memory (FLASH) 111 such as a flash memory or the like that stores programs and data therein so as to be electrically reprogrammable, a RAM112 used for a work area or the like of the CPU110, an AD converter (ADC) 113 that converts an analog signal to a digital signal, a first DA converter (DAC1) 114 that converts a digital signal to an analog signal, a second DA converter (DAC2) 115 that converts a digital signal to an analog signal, a digital input/output port 116, an analog input port 117, other peripheral circuit module (PRPH) 118 such as a timer counter, a serial interface or the like, and a selector (SW2) 119.

The CPU110 performs based on a signal 120, the setting of gain for the programmable gain amplifier 102. The second DA converter 115 DA-converts amp offset data supplied from the CPU110 and supplies an amp offset 121 to the programmable gain amplifier 102. The second DA converter 115 DA-converts data supplied from the CPU110 and outputs the same therefrom. The selector 103 selects an analog signal 123 to be measured targeted for AD conversion, which is supplied from the analog input port 117, or a signal 122 outputted from the first DA converter 114 and supplies the same to the programmable gain amplifier 102. The selector 119 selects the output of the selector 103 or the output of the programmable gain amplifier 102 and supplies the same to the AD converter 113. The CPU 110 refers to data converted by the AD converter 113. The CPU110 performs switch control of the selectors 103 and 119.

There is mainly shown in FIG. 1, a configuration that focuses on the function of obtaining an AD conversion result in which the bit precision of the AD converter 113 has been extended with respect to the resolution of the AD converter 113. In particular, it is intended to be able to obtain the AD conversion result by increasing the resolution of the AD converter over the entire input range of the AD converter 113 in accordance with the program control of the CPU110. The AD conversion function will be described below in detail.

The principle of AD conversion according to the present embodiment will first be described.

Figure 2:
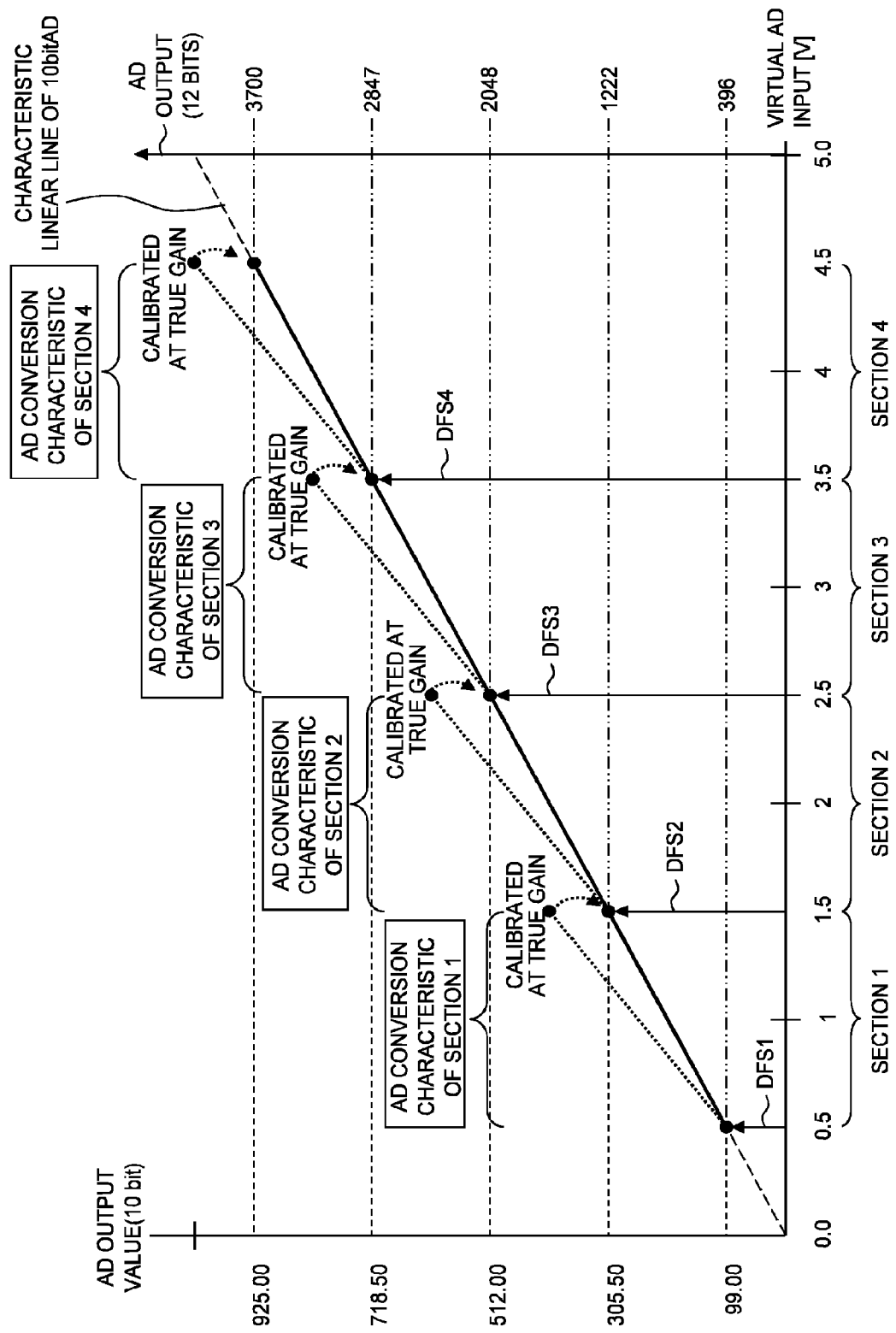
FIG. 2 is an operation explanatory diagram illustrating an AD conversion principle according to the present embodiment as a whole.

The principle of AD conversion according to the present embodiment is illustrated generally in FIG. 2. Here, the resolution of the AD converter 113 is assumed to be 10 bits. It is assumed that the accuracy of conversion is 2 bit-extended. Accordingly, the input range (for convenience, the voltage range for the input range of the AD converter 113 is defined to range from 0.5V to 4.5V) is divided into four. Then, digital offsets (DFS1, DFS2, DFS3 and DFS4) of 12 bits of respective divided ranges are prepared in advance for every section (0.5V to 1.5V, 1.5V to 2.5V, 2.5V to 3.5V and 3.5V to 4.5V) of the divided ranges corresponding to the respective divided voltage ranges. In the AD conversion operation for an analog signal to be measured, an amp offset and target gain 4 (=$2^2$) for amplifying the voltage of the section of the divided range to which the measured analog signal belongs, to the voltage range for the input range of the AD converter 113 are set to the programmable gain amplifier 102, where the measured analog signal is amplified to four times. The amplified signal is converted to 10-bit data by the AD converter 113. A bit extension of 2 bits, for example, a zero extension of 2 bits is made to the lower side with respect to the converted 10-bit data, and the bit-extended data is divided by actually-measured gain of the programmable gain amplifier 102, thereby obtaining AD-converted data of 12 bits in the divided range in which the gain error of the programmable amplifier 102 has been offset. By adding digital offsets (DFS1, DFS2, DFS3 and DFS4) of 12 bits of the corresponding divided ranges to the AD-converted data, the AD-converted data whose bit precision has been extended to 12 bits can be obtained. A gain error of the programmable gain amplifier 102 is offset by the 2-bit bit extension performed on the 10-bit AD-converted data obtained by the divided range to which the measured signal belongs, as described above, and division thereof by actual measurement gain. The voltage determined by the digital offset of each divided range is set so to coincide with the maximum voltage of the divided range on the lower side, and the continuity of the AD conversion result of each section of the divided range is to be assured. A description will be made of those in detail below.

Figure 3:
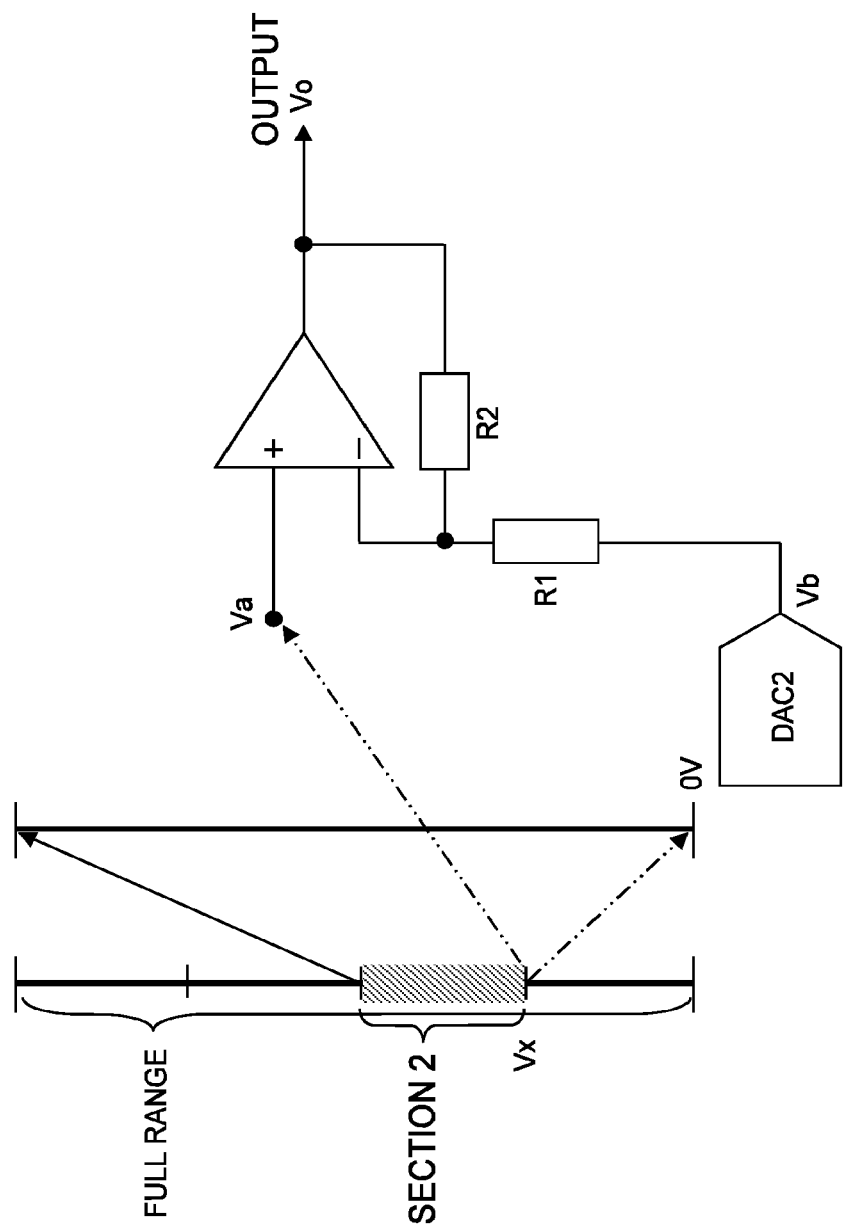
FIG. 3 is an explanatory diagram showing an example of setting an amp offset.

In regard to the setting of the amp offset for the programmable gain amplifier 102, as illustrated in FIG. 3, attention is first paid to a section 2, which is obtained by dividing a full rage into four. Then, a voltage Vx is defined to be the minimum voltage of the section 2. If a voltage Vb obtained from the relational expression of Vo=Va (R1+R2)/R1−VbR2/R1 is assumed to be an amp offset in such a manner that Vo=0V when the input voltage Va=Vx, the input voltage of the section 2 is amplified to be a voltage range for the input range of the AD converter 113.

Figure 4:
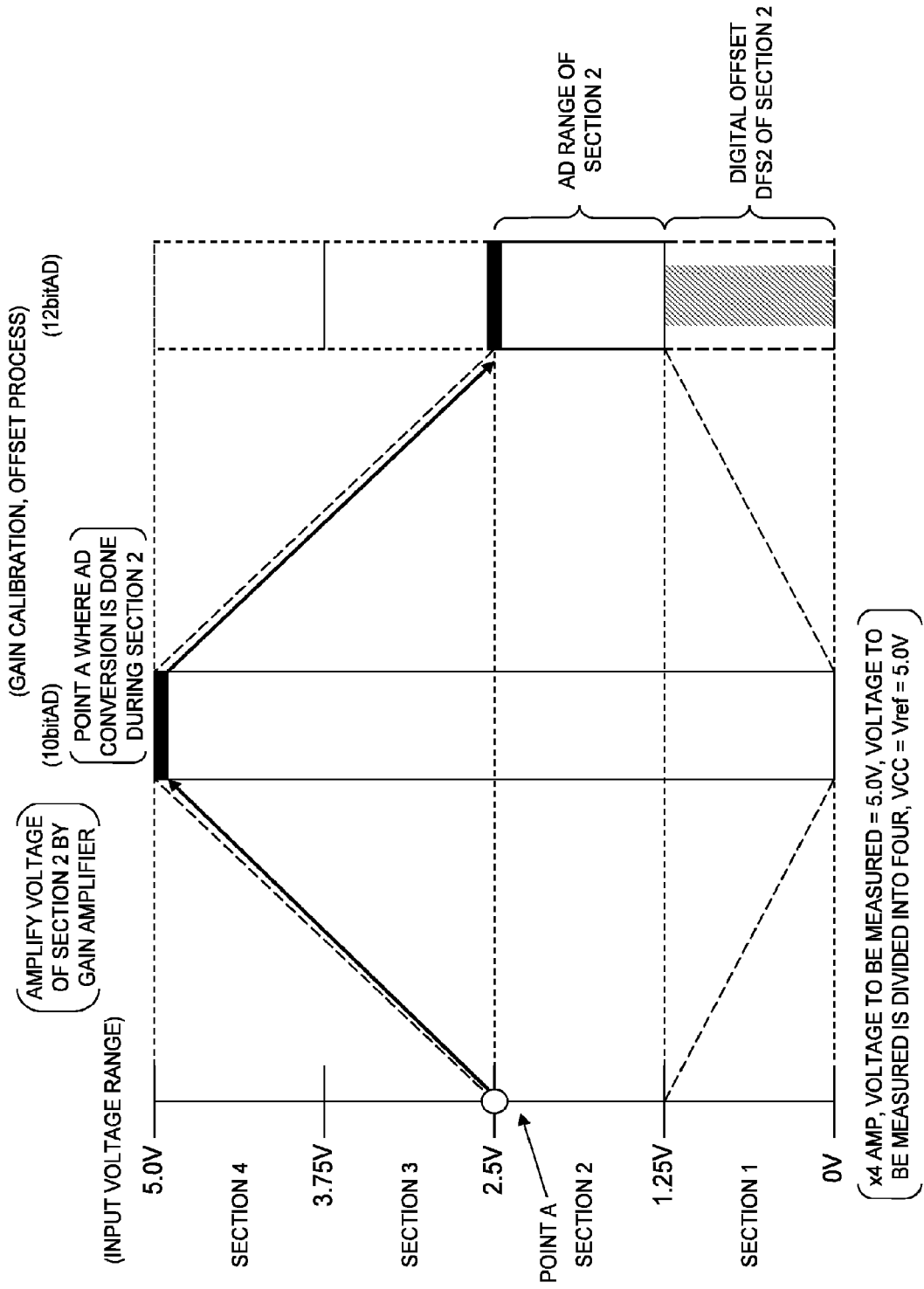
FIG. 4 is an explanatory diagram showing the above AD conversion principle according to the present embodiment by focusing on a section 2 of a divided range.
Figure 5:
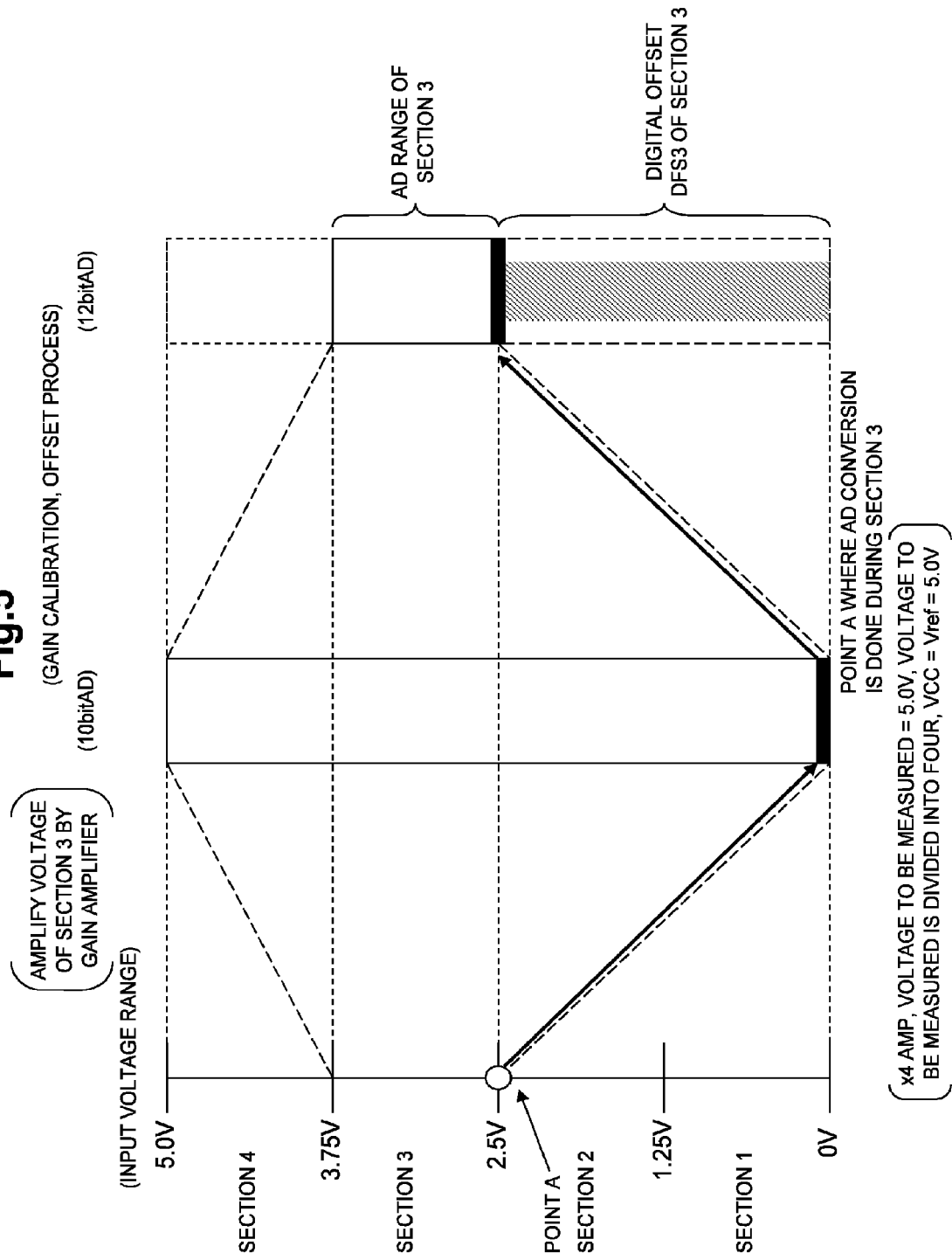
FIG. 5 is an explanatory diagram showing the AD conversion principle according to the present embodiment by focusing on a section 3 of a divided range.

The principle of AD conversion according to the present embodiment is as shown in FIGS. 4 and 5 for example when illustrated by paying attention to the section of the divided range. That is, there is illustrated in FIG. 4, the principle when an analog signal to be measured of a section 2 (the voltage range for the input range of the AD converter 113 is set to 0V to 5V and not consistent with the description of FIG. 2 for convenience in this example) of the divided range is amplified to four times by the programmable gain amplifier 102, the amplified signal is converted into data of 10 bits by the AD converter 113, a zero extension of 2 bits for the data and division of the data by actually measured gain are performed, and a digital offset DFS2 is added to the so-obtained data, thereby obtaining AD-converted data of 12 bits in which a bit precision has been extended. There is illustrated in FIG. 5, the principle when an analog signal to be measured of a section 3 (the voltage range for the input range of the AD converter 113 is set to 0V to 5V and not consistent with the description of FIG. 2 for convenience in this example) of the divided range is amplified to four times, followed by AD conversion, a zero extension of lower 2 bits for the AD-converted 10-bit data and division of the data by actually measured gain are performed, and a digital offset DFS3 is added to the so-processed data, thereby obtaining AD-converted data of 12 bits in which a bit precision has been extended.

Figure 6:
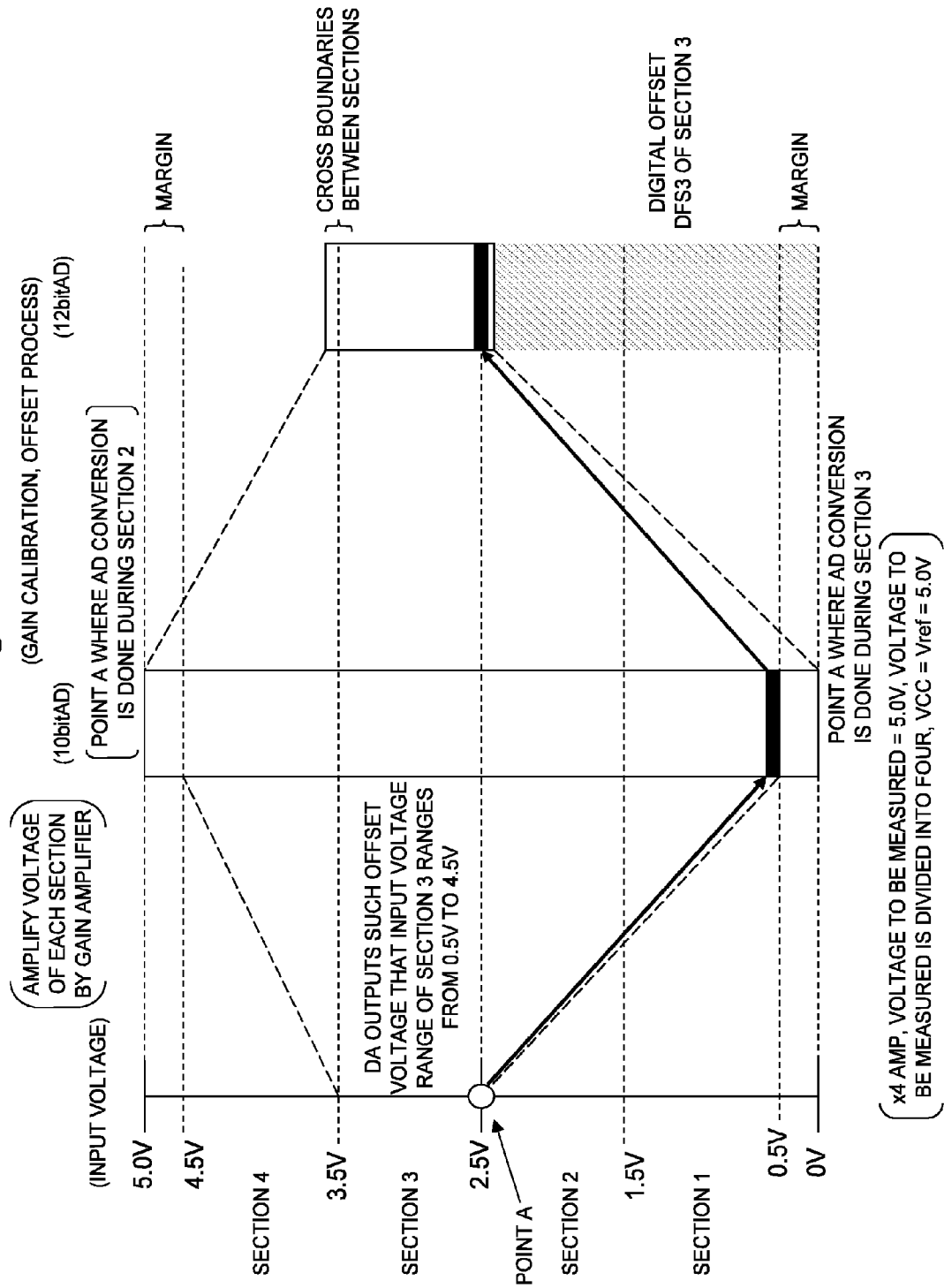
FIG. 6 is an explanatory diagram showing the above AD conversion principle according to the present embodiment by focusing on the section 3 of the divided range and showing where sections are crossed each other within a voltage range in which a programmable gain amplifier keeps the linearity of its amplifying operation.
Figure 7:
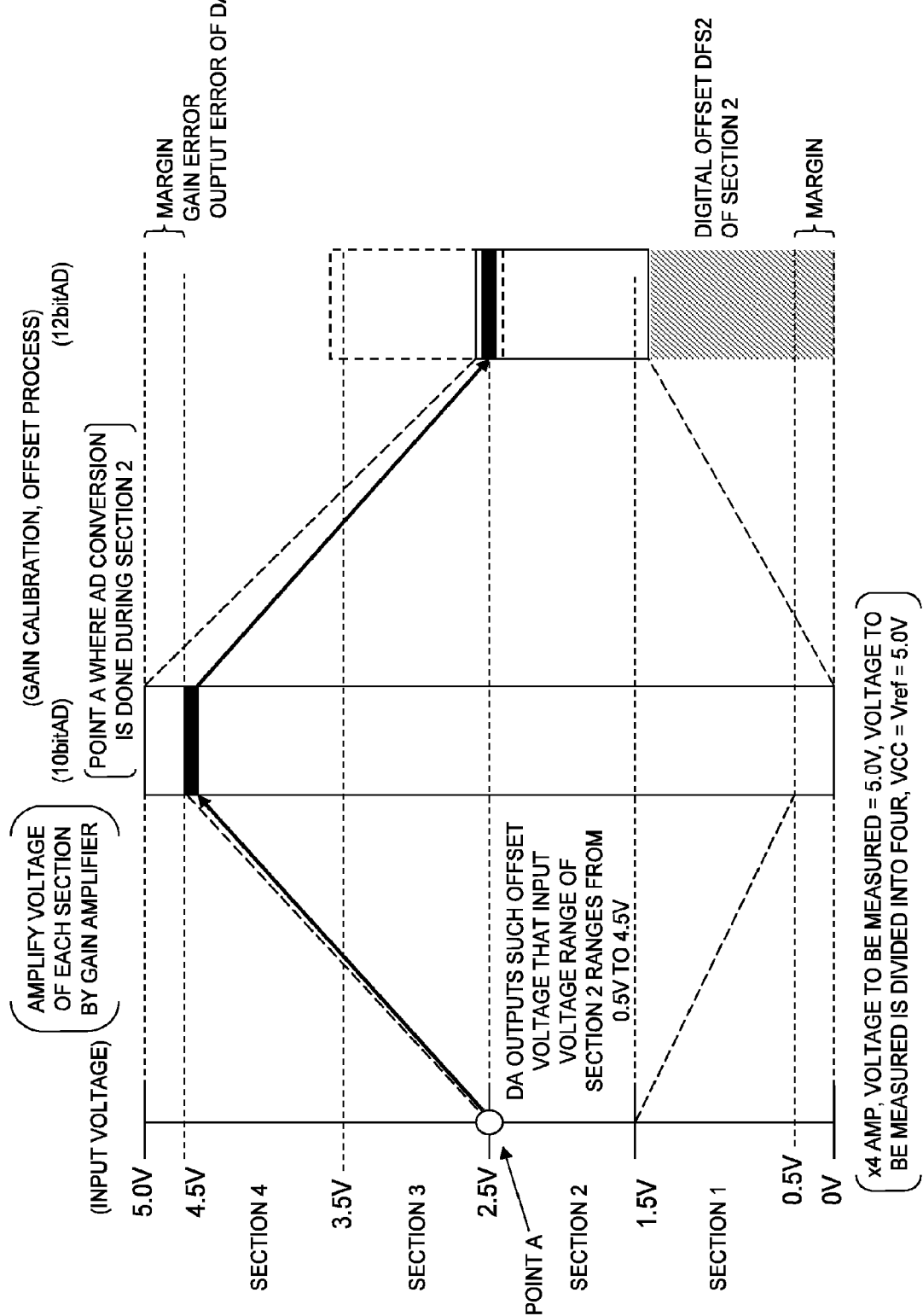
FIG. 7 is an explanatory diagram showing the above AD conversion principle according to the present embodiment by focusing on the section 2 of the divided range and showing

The principle of AD conversion according to the present embodiment is similarly shown in FIGS. 6 and 7 by paying attention to the section of the divided range, but FIGS. 6 and 7 particularly show the case where sections are crossed each other within the voltage range in which the programmable gain amplifier 102 keeps the linearity of its amplifying operation. This is consistent with FIG. 2. There is a case where as the general characteristics of the programmable gain amplifier 102, it is not possible to guarantee the linearity of the amplifying operation satisfactorily in the vicinity of the minimum input voltage and the maximum input voltage. The sections are crossed each other in adjacent portions in such a manner that a gain error does not become large. The voltage ranges of the crossed sections are respectively ensured to have 0.5V as 10% of the input range, for example. In the example of the section 3 in FIG. 6, for example, the amp offset may be determined in such a manner that the input voltage range of the section 3 of 2.5V to 3.5V becomes a range of 0.5V to 4.5V. The digital offset of the section 3 may be determined in such a manner that the maximum voltage of the section 2 coincides with the minimum voltage of the section 3. The details thereof will be explained later. In the example of the section 2 in FIG. 7, the amp offset may be determined in such a manner that the input voltage range of the section 2 of 1.5V to 2.5V becomes the voltage range 0.5V to 4.5V for the input range of the AD converter. The digital offset of the section 2 may be determined in such a manner that the maximum voltage of the section 1 coincides with the minimum voltage of the section 2. The details thereof will be described later.

Figure 8:
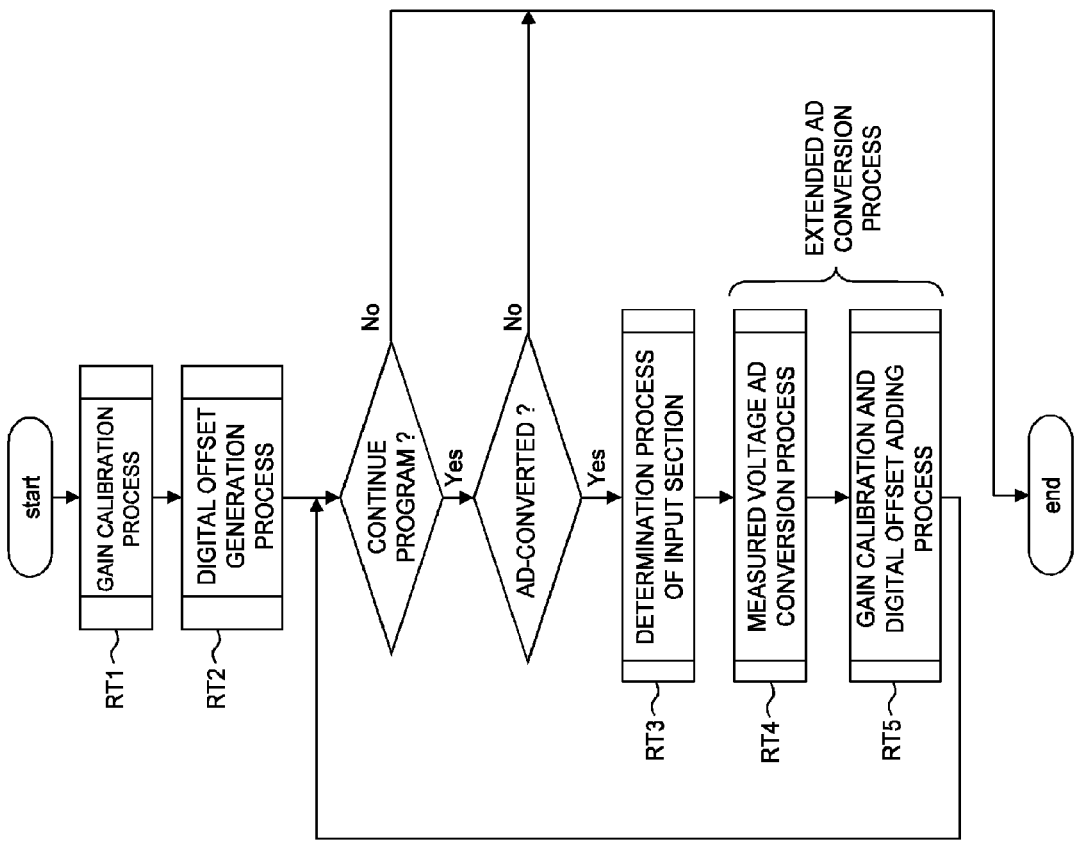
FIG. 8 is a flowchart illustrating as a whole, a conversion process routine by the AD conversion principle according to the present embodiment.

An AD conversion process routine according to the present embodiment in accordance with the above principle is generally shown in FIG. 8. In this AD conversion process, a gain calibration process (RT1) of the programmable gain amplifier and a calculation process (RT2) of a digital offset are performed in advance. Thereafter, so long as the stop of execution of the AD conversion process is not instructed and instructions for AD conversion are given, a determination process (RT3) of the input section, based on the analog signal to be measured, an AD conversion process (RT4) for the measured analog signal by the AD converter, and a gain calibration and a digital offset adding process (RT5) for the result of the AD conversion process (RT4) are performed. The AD conversion process (RT4) and the gain calibration and digital offset adding process (RT5) configure an extended AD conversion process in which AD conversion is performed with the section determined for the measured analog signal being taken as the voltage range for the input range of the AD converter 113.

The gain calibration process (RT1) performs a process for obtaining actually measured gain relative to target gain from the difference between a digital value obtained by converting the output of the programmable gain amplifier 102 having set the target gain ($2^n$, e.g., four times when n=2) by the AD converter 113, and a digital value used for the generation of an analog signal supplied to the programmable gain amplifier 102 at that time. That is, the gain of the programmable gain amplifier is obtained by computation on the basis of the data obtained by amplifying the analog signal output from the first DA converter and converting the same by the AD converter 113 and the data obtained by converting the analog signal by the AD converter 113 without amplifying the same by the programmable gain amplifier 113. The actually measured gain is used for gain calibration in the extended AD conversion process.

The determination process of the input section (RT3) is a process for determining whether the result of conversion for the measured analog signal by the AD converter 113 belongs to any of divided ranges obtained by dividing the input range of the AD converter 113 by m (positive integer). For example, this determination process (RT3) is defined as a process for determining an input range to which a voltage to be measured belongs, based on the AD converted data of the voltage corresponding to the boundary voltage for each divided range of the AD converter 113.

The AD conversion process (RT4) is a process for setting $2^n$ (where n=2) to the programmable gain amplifier 102 as target gain together with the amp offset to expand the voltage range for the determined divided range to the voltage range for the input range of the AD converter and AD-converting an amplified signal of the measured analog signal by the programmable gain amplifier 102 by means of the AD converter 113.

The gain calibration and digital offset adding process (RT5) is a process for performing a zero extension of 2 bits on the lower side of the 10-bit digital data converted by the AD conversion process RT4, dividing the extended 12-bit data by actually measured gain (gain actually measured with respect to target gain $2^n$), adding digital offset data corresponding to the minimum voltage of the divided range corresponding to the 12-bit data subjected to the above division, and thereby obtaining an AD conversion result in which a conversion precision of 12 bits has been extended.

Figure 9:
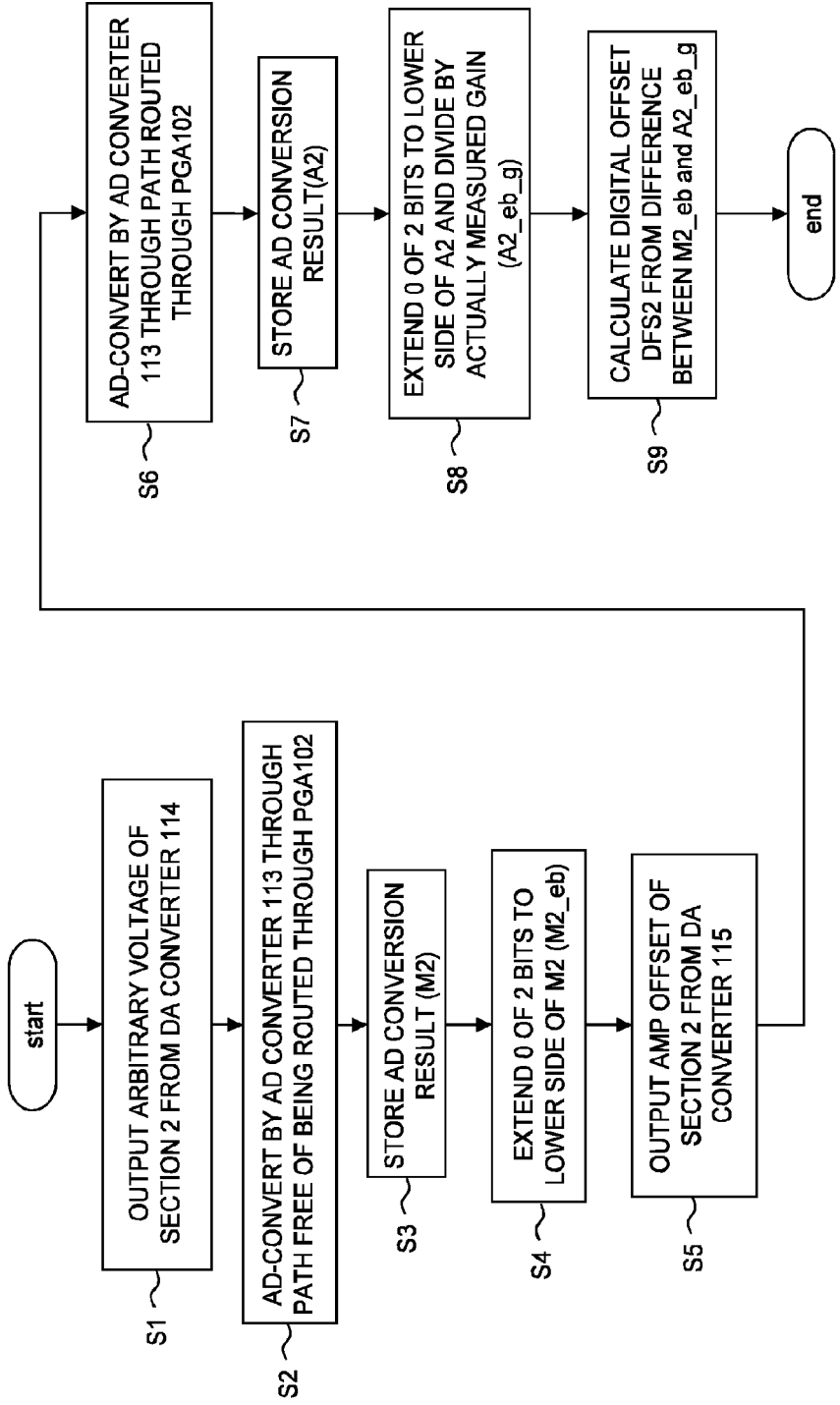
FIG. 9 is a flowchart illustrating the process of generating digital offset data DFS2.
Figure 10:
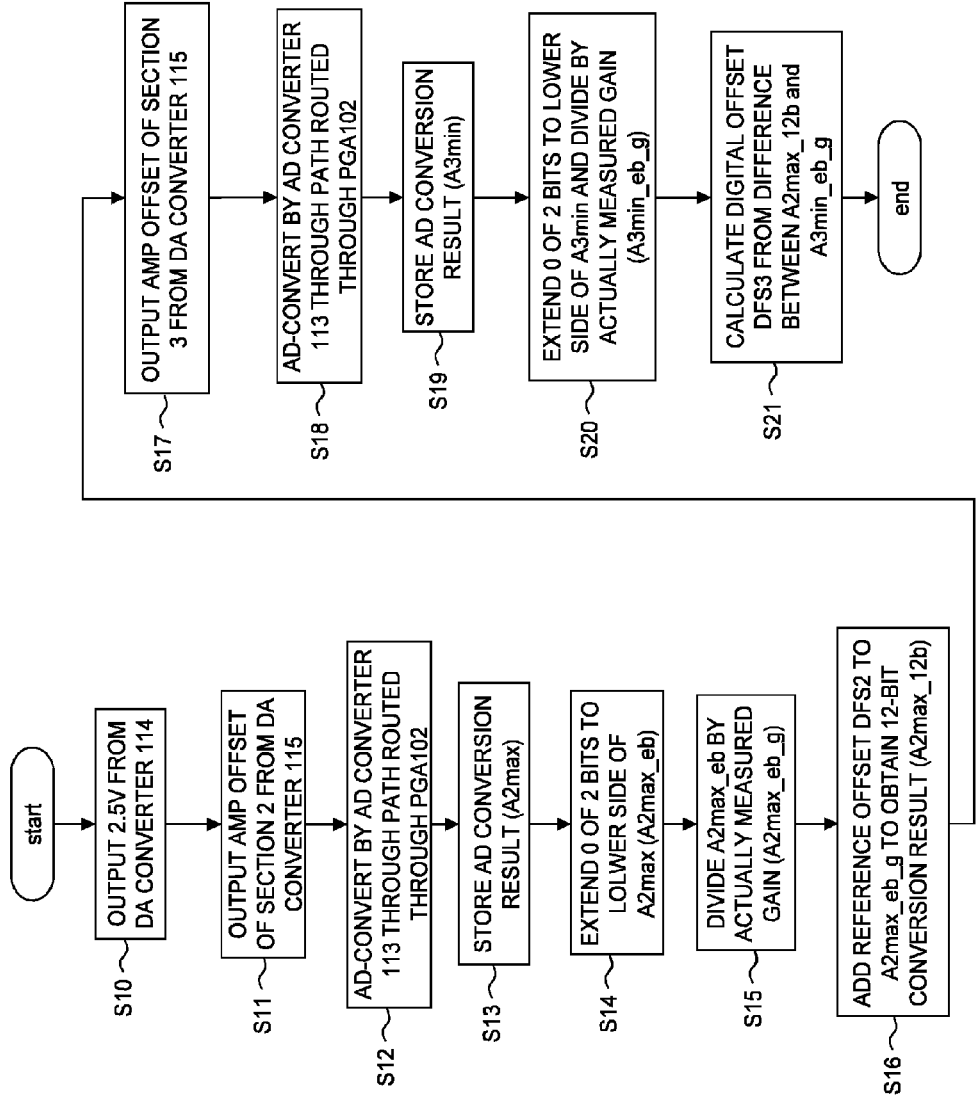
FIG. 10 is a flowchart illustrating the process of generating digital offset data DFS3 of the upper side of the known digital offset data DFS2.
Figure 11:
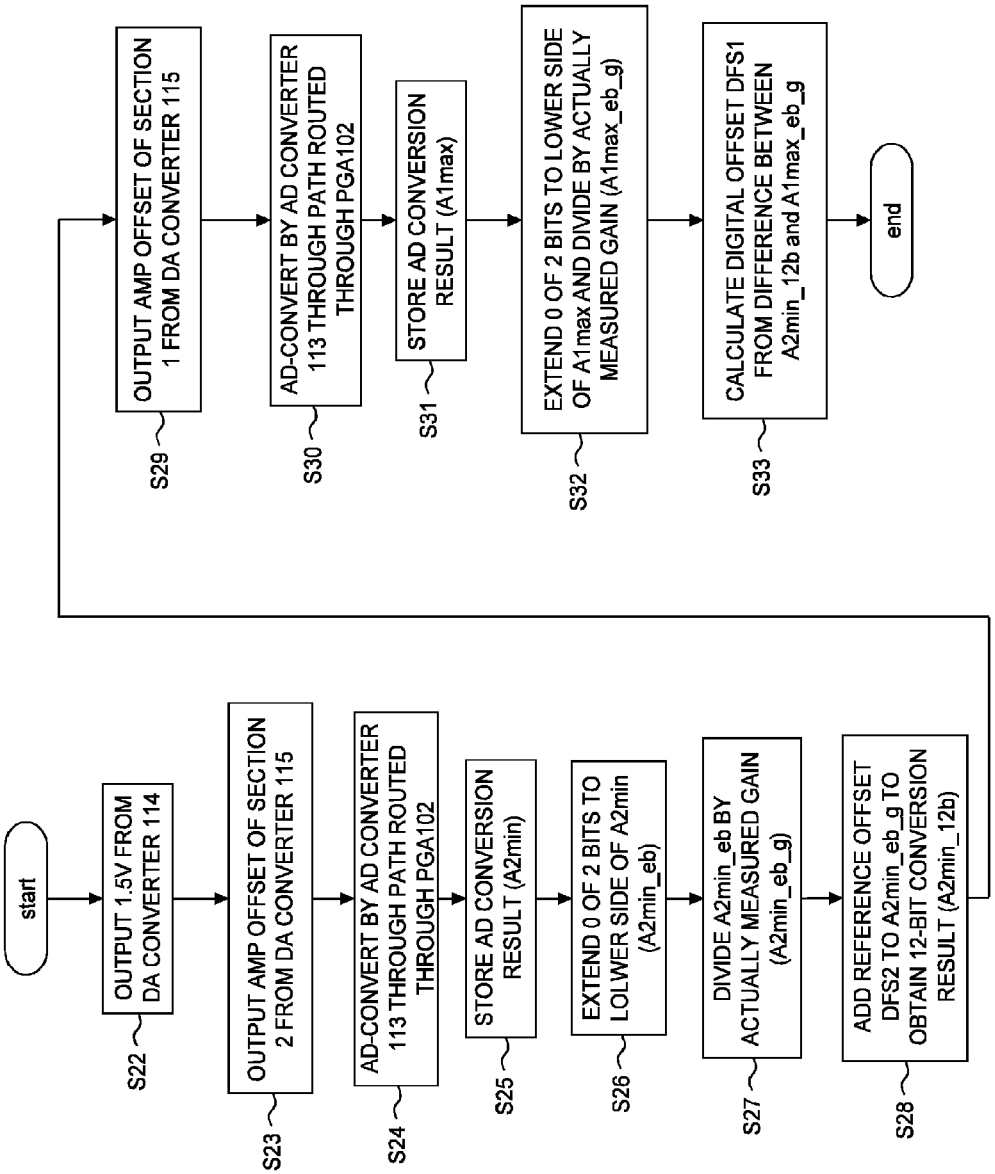
FIG. 11 is a flowchart illustrating the process of generating digital offset data DFS1 of the lower side of the known digital offset data DFS2.

The digital offset generation process (RT2) is roughly divided into a generation process of digital offset data of a section that serves as a reference illustrated in FIG. 9, a generation process of upper digital offset data of a section that serves as a reference illustrated in FIG. 10, and a generation process of lower digital offset data of a section that serves as a reference illustrated in FIG. 11.

In the process of generating the digital offset data DFS2 illustrated in FIG. 9, a first process is first performed which generates any voltage (voltage 2.1V of the section 2, for example) of the specific divided range by the first DA converter 114 (S1), and supplies the same to the AD converter 113 through terminals a and d of the selectors 103 and 119 to obtain AD-converted first data (S2). Thus, 10-bit data that serves as the source of the digital offset data DFS2 is obtained. The CPU110 performs a second process of taking in the first data M2 (S3), and performing a zero extension of 2 bits on the lower side of the taken-in first data M2 to obtain second data M2_eb of 12 bits (S4). Next, the CPU110 performs a third process of generating by the second DA converter 115, an amp offset to expand the voltage range (1.5V to 2.5V) of the divided range to the voltage range for the input range (0.5V to 4.5V) of the AD converter (S5), amplifying the arbitrary voltage generated by the first DA converter 114 by means of the programmable gain amplifier 102 having the generated amp offset and actually measured gain near the target gain, converting the so-amplified signal by the AD converter 113 (S6), and taking third data A2 obtained by conversion therein (S7). The CPU110 performs a fourth process of performing a zero extension of 2 bits on the lower side of the third data A2 and performing division thereof by the actually measured gain to thereby obtain fourth data A2_eb_g (S8). Finally, the CPU110 performs a fifth process of subtracting the fourth data A2_eb_g from the second data M2_eb to obtain reference digital offset data DFS2 (fifth data) of the specific divided range (S9).

According to the process of FIG. 9, the digital offset data DFS2 substantially coincides with the value obtained by AD converting the arbitrary voltage in the voltage range for the input range of the AD converter 113 without via the programmable gain amplifier 102. Then, in the voltage range of the section set as the reference, the value obtained by adding the digital offset data DFS2 to the value obtained by n-bit extending the result of AD conversion of the voltage range for the input range amplified by the programmable gain amplifier and dividing the same by the actually measured gain, and the value directly AD-converted without via the programmable gain amplifier substantially coincide with each other.

In the process of generating the digital offset data DFS3 of the section 3 corresponding to the upper side of the section 2 illustrated in FIG. 10, a sixth process is performed in which after the digital offset data DFS2 has been generated, the maximum voltage 2.5V of the section 2 corresponding to the specific divided range is generated by the first DA converter 114 (S10) and an amp offset to expand the voltage range (1.5V to 2.5V) of the divided range (section 2) to the voltage range (0V to 5V) for the input range of the AD converter 113 is generated by the second DA converter 115 (S11), and the maximum voltage 2.5V of the section 2 generated by the first DA converter 114 is amplified by the programmable gain amplifier 102 to which the generated amp offset and target gain have been set, followed by conversion of the amplified signal by the AD converter 113 (S12) to thereby obtain sixth data A2max (S13). The CPU110 performs a seventh process of performing a zero extension of 2 bits on the lower side of the sixth data A2max to generate tentative data of 12 bits (A2max_eb) (S14), dividing the data A2max_eb by the actually measured gain to generate data A2max_eb_g (S15) and adding the digital offset data DFS2 to the data A2max_eb_g to acquire seventh data A2max_12b corresponding to 12-bit AD-converted data (S16).

Then, the CPU110 performs an eighth process of generating by the second DA converter 115, an amp offset to expand the voltage range (2.5V to 3.5V) of the upper divided range (section 3) to the input range of the AD converter (S17) and converting a signal amplified as the minimum voltage 2.5V of the section 3 by the AD converter 113 (S18) to obtain eighth data A3min (S19). Finally, the CPU110 performs a ninth process of performing the zero extension of 2 bits to the lower side of the eighth data A3min and division by the actually measured gain to generate data A3min_eb_g (S20), subtracting the generated data A3min_eb_g from the seventh data A2max_12b to obtain the digital offset data DFS3 (ninth data) of the upper divided range (section 3) (S21).

Thus, the continuity of the AD-converted data of the section 2 and the AD-converted data of the section 3 is secured. In other words, the voltage (2.5V) at the point of connection of the specific divided range (section 2) in which the known digital offset data DFS2 has been determined by the above process, and the upper divided range (section 3) adjacent to the specific divided range is computed using the known digital offset data DFS2 so as to match in both divided ranges. It is therefore possible to ensure the continuity of the specific divided range (section 2) and the upper divided range (section 3) adjacent thereto. In other words, in the voltage range for the upper divided range, the value obtained by adding the digital offset data DFS3 to the value obtained by n-bit extending the result of AD-conversion of the voltage range for the input range amplified by the programmable gain amplifier and dividing the same by the actually measured gain, and the value AD-converted directly without via the programmable gain amplifier substantially coincide with each other. Particularly since the bit extension of n bits and division thereof by the actually measured gain are performed on the values AD-converted in the respective divided ranges, it is possible to eliminate the effect of a gain error of the programmable gain amplifier 102 and ensure its continuity with high precision.

Incidentally, since the digital offset data DFS4 may be determined by a process similar to FIG. 10 on the basis of the known digital offset data DFS3, its detailed description is omitted.

In the process of generating the digital offset data DFS1 of the lower side of the known digital offset data DFS2 illustrated in FIG. 11, a tenth process is performed in which after the digital offset data DFS2 has been generated, the minimum voltage (1.5V) of the specific divided range (section 2) is first generated by the first DA converter 114 (S22) and an amp offset to expand the voltage range (1.5V to 2.5V) of the corresponding divided range (section 2) to the input range (0V to 5V) of the AD converter 113 is generated by the second DA converter 115 (S23), and the minimum voltage 2.5V generated by the first DA converter 114 is amplified by the programmable gain amplifier 102 to which the generated amp offset and target gain have been set, followed by conversion of the amplified signal by the AD converter 113 (S24) to thereby obtain tenth data A2min (S25). The CPU110 performs an eleventh process of generating tentative data A2min_eb of 12 bits in which a zero extension of 2 bits has been performed on the lower side of the tenth data A2min (S26), dividing the data A2min_eb by the actually measured gain to generate data A2min_eb_g (S27), and adding the digital offset data DFS2 to the data A2min_eb_g to acquire eleventh data (A2min 12b) corresponding to 12-bit AD-converted data (S28).

Next, the CPU110 performs a twelfth process of generating the maximum voltage (1.5V) of the divided range (section 1) of the lower side by the first DA converter 114 and generating by the second DA converter 115, an amp offset to expand the voltage range (0.5V to 1.5V) of the corresponding divided range to the input range (0V to 5V) of the AD converter 113 (S29), and amplifying the maximum voltage (1.5V) generated by the first DA converter 114 by means of the programmable gain amplifier 102 to which the generated amp offset and target gain have been set, followed by conversion of the amplified signal by the AD converter 113 (S30) to thereby obtain twelfth data A1max (S31). Finally, the CPU110 performs a thirteenth process of performing a zero extension of 2 bits to the lower side of the twelfth data A1max and division thereof by the actually measured gain to generate data A1max_eb_g (S32), subtracting the generated data A1max_eb_g from the eleventh data A2min 12b to obtain the digital offset data DFS1 of the lower divided range (section 1) (S33).

Thus, the continuity of the AD-converted data of the section 2 and the AD-converted data of the section 1 is secured. That is, the voltage (1.5V) at the point of connection of the specific divided range (section 2) in which the known digital offset data DFS2 has been determined by the above process, and the lower divided range (section 1) adjacent to the specific divided range is computed using the known digital offset data DFS2 so as to match in both divided ranges. It is therefore possible to ensure the continuity of the specific divided range (section 2) and the lower divided range (section 1) adjacent thereto. In other words, in the voltage range for the lower divided range, the value obtained by adding the digital offset data DFS1 to the value obtained by n-bit extending the result of AD-conversion of the voltage range for the input range amplified by the programmable gain amplifier and dividing the same by the actually measured gain, and the value AD-converted directly without via the programmable gain amplifier substantially coincide with each other. Particularly since the bit extension of n bits and division thereof by the actually measured gain are performed on the values AD-converted in the respective divided ranges, it is possible to eliminate the influence of a gain error of the programmable gain amplifier and ensure its continuity with high precision.

Figure 12:
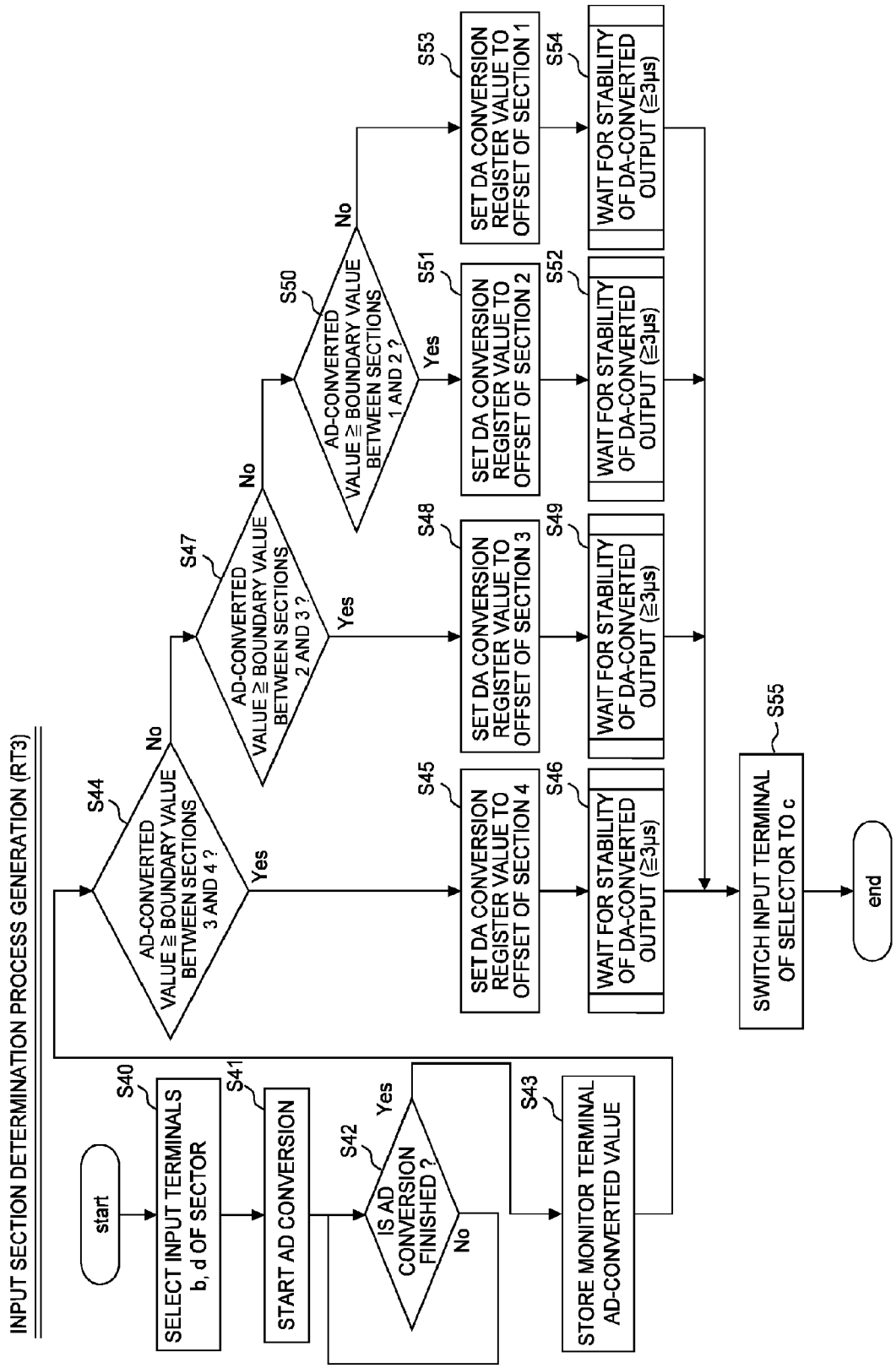
FIG. 12 is a flowchart illustrating the details of a determination process RT3 of an input section and the AD conversion process RT4.

The details of the determination process (RT3) and the AD conversion process (RT4) of the input section are illustrated in FIG. 12. The selector 103 is selected to the input terminal b and the selector 119 is selected to the input terminal d (S40). The AD converter 113 AD-converts the analog signal to be measured (S41 and S42). The CPU110 takes in the result of AD conversion thereof (S43) and determines whether the result of AD conversion is larger than the value of the boundary between the sections 3 and 4 (S44). If it is larger, the CPU110 sets the amp offset data of the section 4 to a DA conversion register for the amp offset (S45) and waits for stability of the conversion operation of the first DA converter 114 (S46). When the AD conversion result is smaller than the value of the boundary between the sections 3 and 4, the CPU110 determines whether the AD conversion result is larger than the value of the boundary between the sections 2 and 3 (S47). If it is larger, the CPU110 sets the amp offset data of the section 3 to the DA conversion register for the amp offset (S48) and waits for stability of the conversion operation of the first DA converter 114 (S49): Likewise, when the AD conversion result is smaller than the value of the boundary between the sections 2 and 3, the CPU110 determines whether the AD conversion result is larger than the value of the boundary between the sections 1 and 2 (S50). If it is larger, the CPU110 sets the amp offset data of the section 2 to the DA conversion register for the amp offset (S51) and waits for stability of the conversion operation of the first DA converter 114 (S52). Similarly when the AD conversion result is smaller than the value of the boundary between the sections 1 and 2, the CPU110 sets the amp offset data of the section 1 to the DA conversion register for the amp offset (S53) and waits for stability of the conversion operation of the first DA converter 114 (S54). After the time (e.g., 3 µs) required to wait for each stability has elapsed, the CPU110 connects the input of the selector 119 to the output of the PGA102 (S55). Thus, a process of setting $2^n$ (gain 4 herein) to the programmable gain amplifier 102 as target gain along with an amp offset to expand the determined voltage range for the divided range to the input range of the AD converter 113 and converting the amplified signal of the measured analog signal by the programmable gain amplifier 102 by means of the AD converter 113 is performed.

Figure 13:
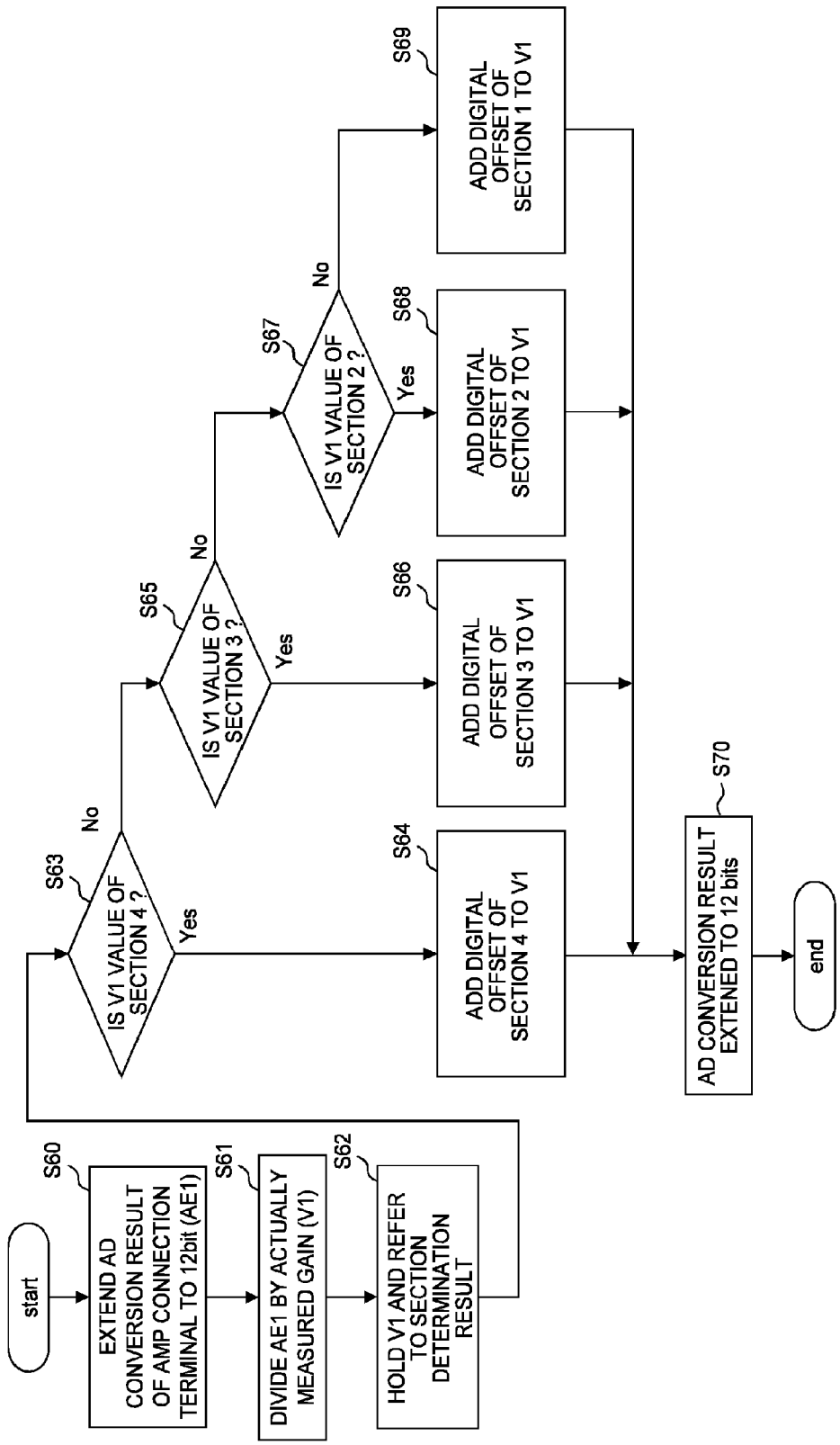
FIG. 13 is a flowchart illustrating the details of gain calibration and a digital offset adding process RT5.

The details of the gain calibration and the digital offset adding process (RT5) are illustrated in FIG. 13. The CPU110 performs the zero extension of n bits (2 bits herein) on the digital data converted by the AD converter 113 on its lower side in accordance with the AD conversion process (RT4) to generate data AE1 of 12 bits (S60). Along with it, the CPU110 divides the data AE1 by actually measured gain (S61) and holds data (V1) about the computation result therein and refers to the result of determination by the determination process (RT3) of the input section (S62). The CPU110 adds a digital offset of the section 4 to the computation result data V1 if the determination result by the input section determination process (RT3) is the section 4 (S63 and S64). If the determination result by the input section determination process (RT3) is the section 3, the CPU110 adds a digital offset of the section 3 to the computation result data V1 (S65 and S66). If the determination result by the input section determination process (RT3) is the section 2, the CPU110 adds a digital offset of the section 2 to the computation result data V1 (S67 and S68). If the determination result by the input section determination process (RT3) is the section 1, the CPU110 adds a digital offset of the section 1 to the computation result data V1 (S69) and holds data of the addition result as the AD conversion result extended to 12 bits (S70).

Figure 14:
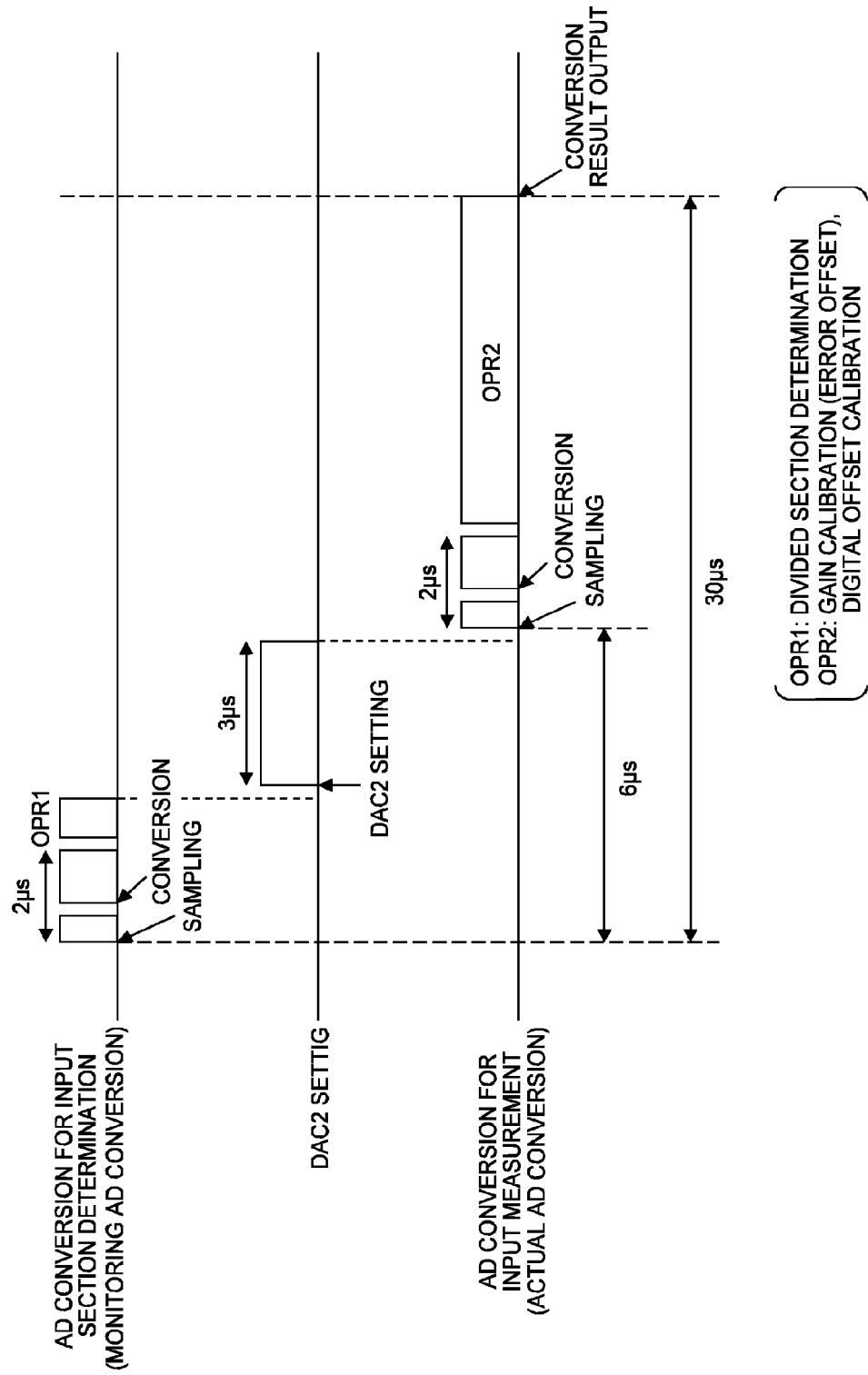
FIG. 14 is a timing chart illustrating an AD conversion operation according to the present embodiment.

A timing chart of the AD conversion operation by the AD function according to the present embodiment is illustrated in FIG. 14. As shown in the figure, the sampling of the measured analog signal and the AD conversion operation for AD conversion by the AD converter 113 are performed in the order of an operation (monitoring AD conversion) for the input section determination, and an input measurement operation (actual AD conversion) for expansion AD conversion. After the monitoring AD conversion, determination of the divided section is performed using it (OPR1). After the actual AD conversion, operations such as a bit extension, a gain calibration, addition of a digital offset are performed (OPR2). Since it is possible to obtain the AD conversion result expanded to 12 bits by the AD conversion according to the present embodiment by, for example, spending 2 μs for one sampling and conversion and taking 30 μs together, processing can be performed at a higher speed than a general ΔΣAD converter.

According to the first embodiment described above, there can finally be obtained the AD conversion result in which the bit extension of the n bits has been made in the range that satisfies the relationship of $2^n \leq m$ according to the division number m for the input range of the AD converter 113. At this time, the programmable gain amplifier 102 performs amplification at or near gain $2^n$ according to consistency with the amplification being performed by applying the amp offset with the determined scope or range for the divided range as the full range of the AD converter 113 from the second DA converter 115 to the programmable gain amplifier 102. Thus, it is possible to increase the resolution of the AD converter 113 over the entire conversion range of the AD converter 113. Since the determination may be done by performing AD conversion once by the AD converter 113 without amplification by the programmable gain amplifier 102 even in selecting the conversion range, a good tracking property can be obtained even for switching of the conversion range. Further, since the values at which the values at the connection point of the divided ranges become the same in both divided ranges are obtained for the digital offsets of the respective divided ranges, it is possible to reduce the conversion error for the AD conversion result of high resolution over the entire conversion range of the AD converter 113. Since the bit extension is performed on the digital data obtained by AD-converting the input of the divided range in the voltage range for the input range of the AD converter 113 and the extended data is divided by the actually measured gain, it is possible to eliminate the effect of a gain error of the programmable gain amplifier.

<<Second Embodiment>>

A description will be made of a process of obtaining a digital offset of each divided range by a method different from the first embodiment in a second embodiment. Although not particularly shown in the figure here, for example, since the digital offset of a section that serves as a specific criteria or reference substantially coincides with the minimum voltage of a specific section, the minimum voltage of the specific section is AD-converted by the AD converter 113, so that 12-bit data that makes a zero extension of 2 bits on the lower side can brought to a digital offset of a section serving as a reference. For example, 2.5V is output from DAC1 and AD-converted by ADC113 without being amplified by PGA102, and the following bit extension of 2 bits is performed on the conversion result data, so that it is defined as a digital offset of a section that serves as a reference.

From the fact that the digital offset of the upper section of the specific section substantially coincides with the maximum voltage of the specific section, the minimum voltage of the specific section is AD-converted by the AD converter 113 and a zero extension of 2 bits is performed on the lower side, followed by division thereof by actually measured gain. The known digital offset data of the section that serves as the reference is added to the result of division, and the so-obtained extended AD conversion result of 12 bits can be set as a digital offset therefor. Incidentally, a digital offset of a section further on the upper side thereof with respect to the upper section can also be obtained by the same process, based on the known digital offset of the upper section.

From the fact that the digital offset of the lower section of the specific section substantially coincides with the difference with the minimum voltage of the specific section, the minimum voltage of the specific section is AD-converted by the AD converter 113 and a zero extension of 2 bits is performed on the lower side, followed by division thereof by actually measured gain. A difference between the division result and the digital offset data of the known section that serves as the reference can be defined as a digital offset therefor. Incidentally, a digital offset of a section further on the lower side thereof with respect to the lower section can also be obtained by the same process, based on the known digital offset of the lower section.

According to the process of the second embodiment, it is possible to contribute to an improvement in processing efficiency to obtain a digital offset.

<<Third Embodiment>>

Figure 15:
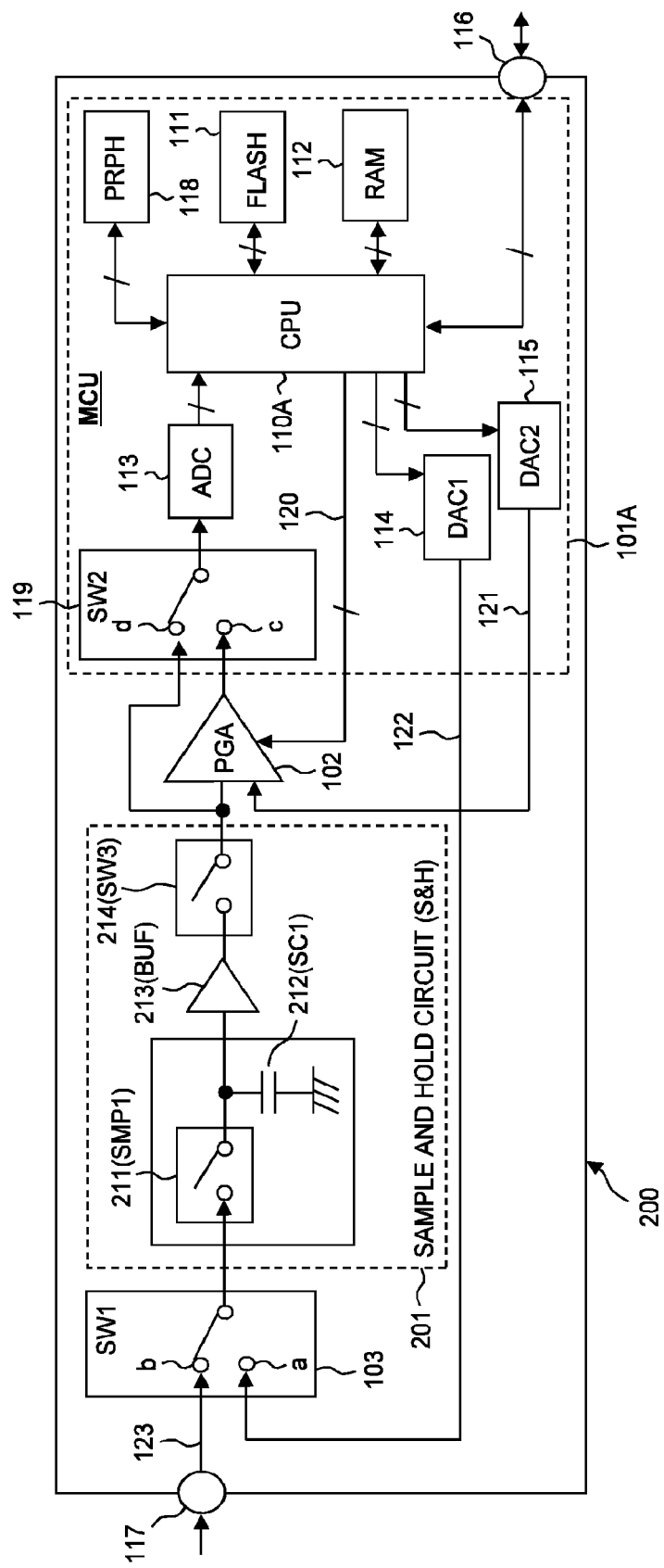
FIG. 15 is a block diagram illustrating a data processing system according to a second embodiment of the present invention.

A data processing system according to a second embodiment of the present invention is illustrated in FIG. 15. The data processing system 200 shown in the same figure is different from the data processing system of FIG. 1 in that a sample and hold circuit 201 is added as compared therewith, and a CPU110A that performs control correspondingly is adopted. That is, the day processing system 200 has the sample and hold circuit 201 that inputs an analog signal to be measured. The CPU110A performs using the same measured analog signal 123 sampled by the sample and hold circuit 201, a process for determination as to each divided range and the extended AD conversion using the result of its determination. The sample and hold circuit 201 is configured to include a sampling switch (SMP1) 211, a sampling capacitor (SC1) 212, an output buffer (BUF) 213 and an output selector switch (SW3) 214. The same components in other configurations as those in FIG. 1 are respectively denoted by the same reference numerals, and the detailed description thereof will be omitted.

Figure 16:
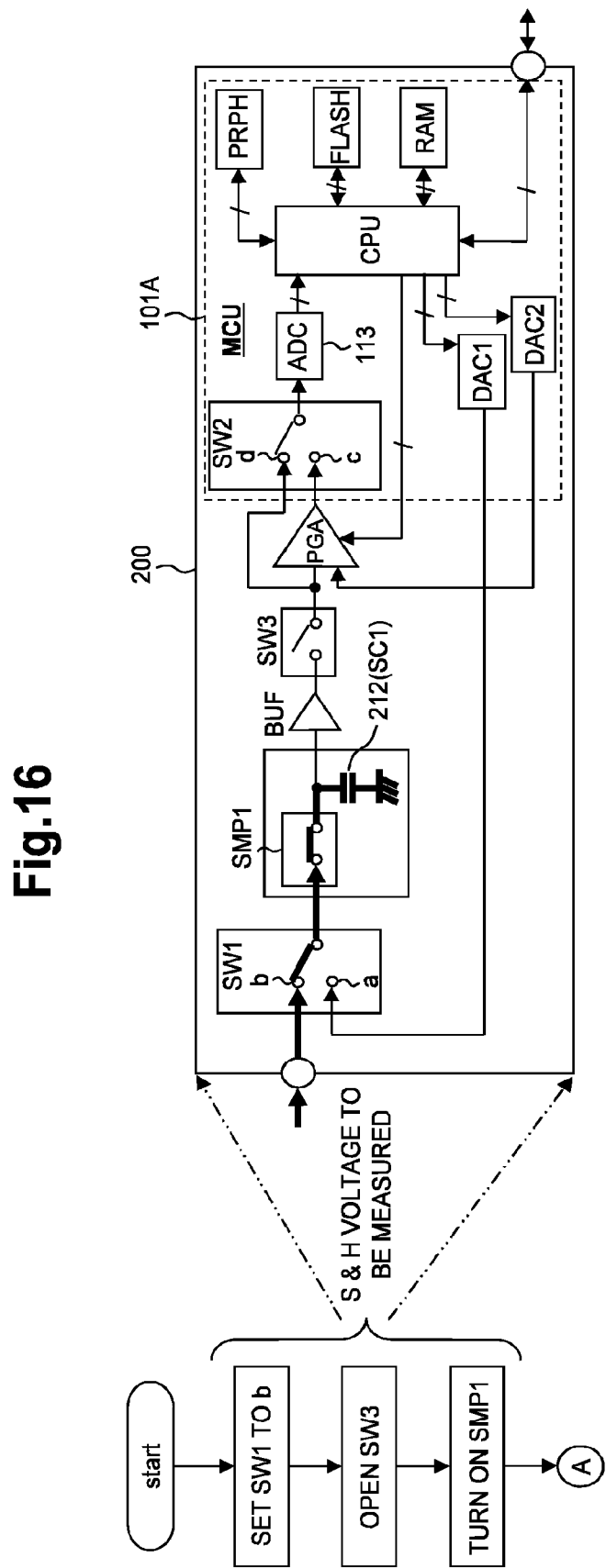
FIG. 16 is an operation explanatory diagram illustrating a sample-and-hold operation of an analog signal to be measured.

A sample and hold operation of the measured analog signal is illustrated in FIG. 16. After the charge signal required for the sampling capacitor 212 has been accumulated, the sampling switch 211 is closed.

Figure 17:
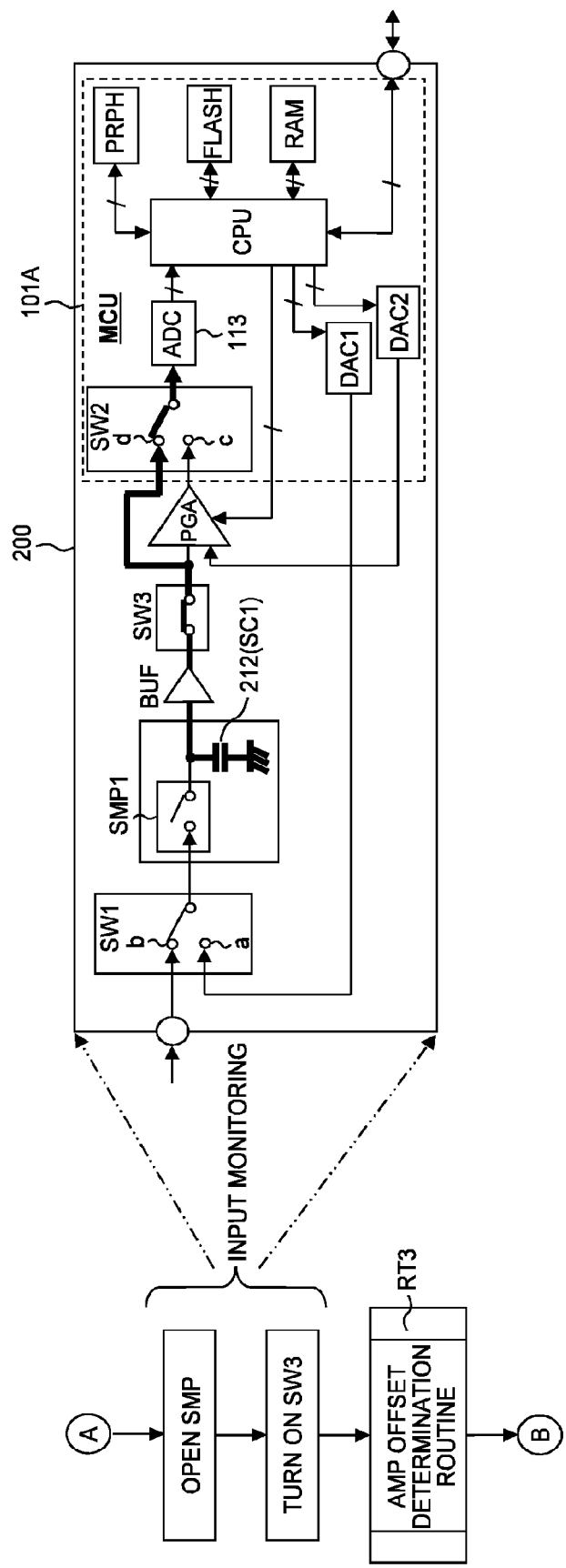
FIG. 17 is an operation explanatory diagram illustrating the operation of allowing information held in a sample and hold circuit 201 to pass through a PGA 102 and AD-converting the information by an ADC113.

The operation of allowing information held in the sample and hold circuit 201 to pass through PGA102 and AD-converting it by ADC113 is illustrated in FIG. 17. The determination process (RT3) of the input section and the measured voltage AD conversion process (RT4) both described in FIG. 8 are performed using AD-converted data obtained by the monitoring operation.

Figure 18:
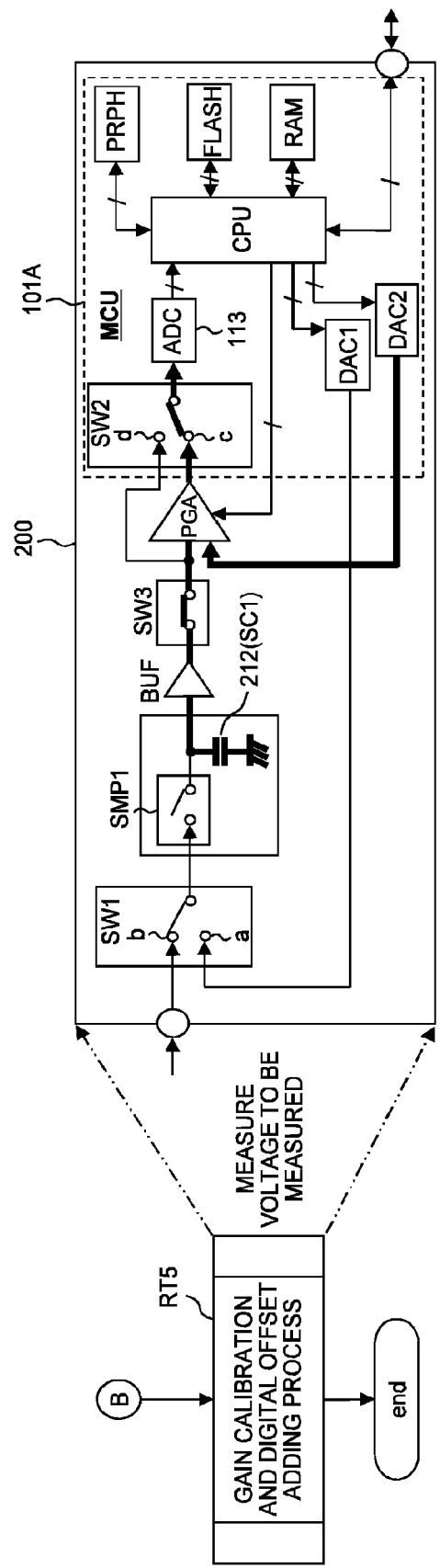
FIG. 18 is an operation explanatory diagram illustrating the operation of a gain calibration and a digital offset adding process RT5.

The operation of the gain calibration and digital offset adding process (RT5) is illustrated in FIG. 18. During this operation, the signal to be measured may be received from the sample capacitor 212, and the analog signal to be measured needs not to be input from outside again.

According to the second embodiment, since it is possible to perform determination of each divided range and the AD conversion using the result of its determination on the same measured analog signal, it is possible to prevent occurrence of a situation in which AD conversion is accidentally performed using different divided ranges, before it happens.

<<Fourth Embodiment>>

In the description of the above embodiment, the division number m of the input range has been described as four. That is, when it is the extended bit number n=2 of the AD conversion result by AD according to the present embodiment, the number of divisions was set to $2^n=2$. Theoretically, the division number m may be arbitrarily determined within a range satisfying the relationship of $2^n \leq m$.

At this time, it is generally considered to be advisable to reduce the midpoint of a dynamic signal to half of the input voltage range of the AD converter in order to take full advantage of the performance (resolution) of the AD converter for the dynamic signal, such as represented by a periodic signal. In the case of the AD conversion system that divides the input range as described in the above embodiment, the half of the input voltage range of the AD converter serves as the boundary between the adjacent divided ranges when the division number is set even. In this regard, the difference in processing efficiency occurs in the AD conversion according to the present embodiment depending on whether to adopt either even or odd as the division number m. A third embodiment will describe this point.

Figure 19:
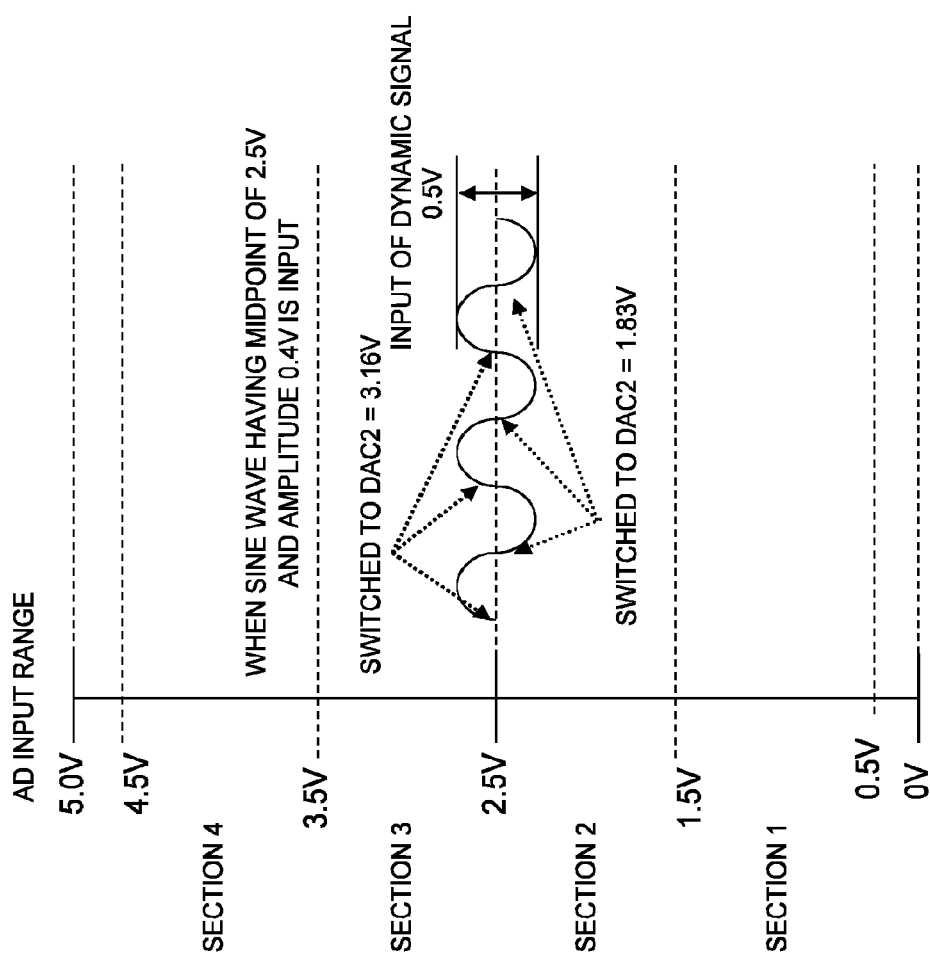
FIG. 19 is an operation explanatory diagram illustrating the case where when the central value of the measured analog signal is close to the central value of the input range of the AD converter, the number of divisions of an input range of the AD converter is set to an even number to perform an AD conversion process.

FIG. 19 illustrates where when the central value of an analog signal to be measured is close to the central value of the input range of the AD converter 113, the number of divisions of the input range of the AD converter 113 is set to an even number to perform the conversion process of AD according to the present embodiment. As is apparent from the drawing, the voltage 2.5V of the central value of the periodic signal becomes a voltage at the boundary between the sections 2 and 3. In this case, as a result that the value of one periodic signal belongs both of the different sections 2 and 3 adjacent to each other in the AD conversion operation according to the embodiment described above, the switching of an amp offset must frequently be performed depending on the value of the measured analog signal, and the time required to wait for the stability of the ADC113 with it becomes longer. Thus, the efficiency of the conversion process according to the present embodiment is degraded.

Figure 20:
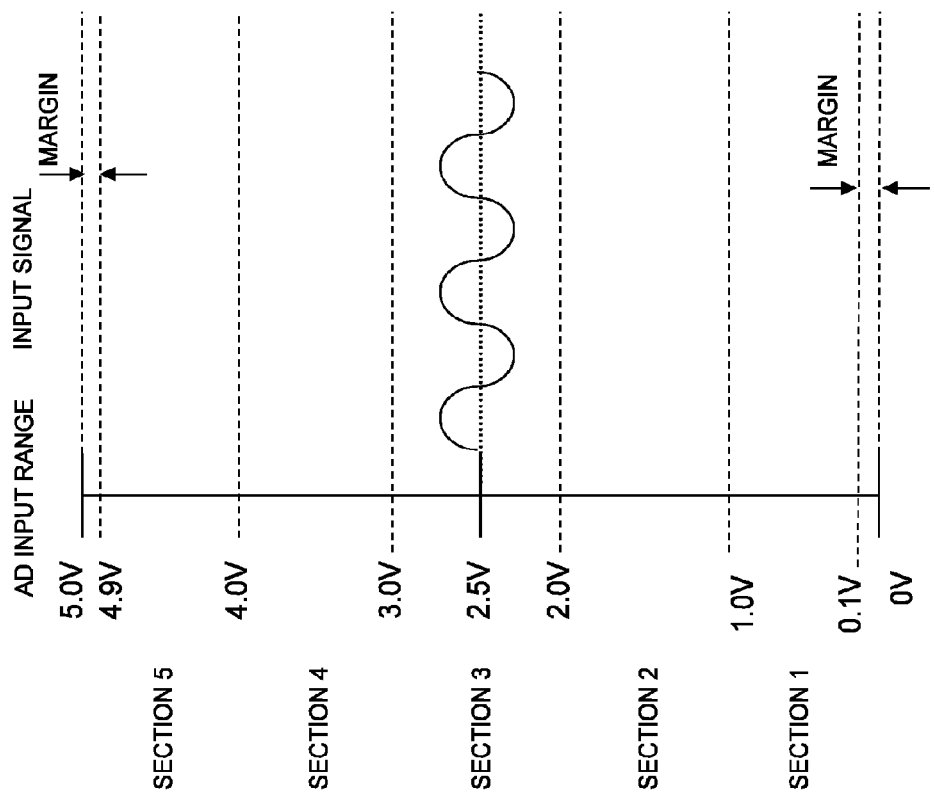
FIG. 20 is an explanatory diagram according to a third embodiment in the case where when the central value of an analog signal to be measured is close to the central value of an input range of an AD converter, the number of divisions of the input range of the AD converter is set to an odd number, e.g., five to control an AD conversion process so as to be performed.

To avoid this, as illustrated in FIG. 20, the CPU110 (110A) may perform control to set the division number of the input range of the AD converter 113 to an odd number, e.g., five when the central value of the measured analog signal is close to the central value of the input range of the AD converter 113 and thereby perform the conversion process of AD according to the present embodiment. Thus it is possible to prevent the central value of the measured analog signal 123 from being close to the boundary between the divided ranges. Accordingly, it becomes easy to hold the range of a change in the measured analog signal in one section, and it is not necessary to perform the process of changing the divided range each time the measured analog signal changes beyond its central value. It is thus possible to improve the efficiency of the AD conversion process in which the bit precision has been extended.

In the example of FIG. 20 in particular, the voltage range for each divided range is 1V as with the first embodiment, and the target gain of the programmable gain amplifier 102 remains $2^2$ for an extended number of bits n=2. The input range by the AD converter 113 has been spread like 0.1V to 4.9V, for example. In short, a margin corresponding to the capability of the AD converter 113 may be considered at parts across the input range.

<<Fifth Embodiment>>

Figure 21:
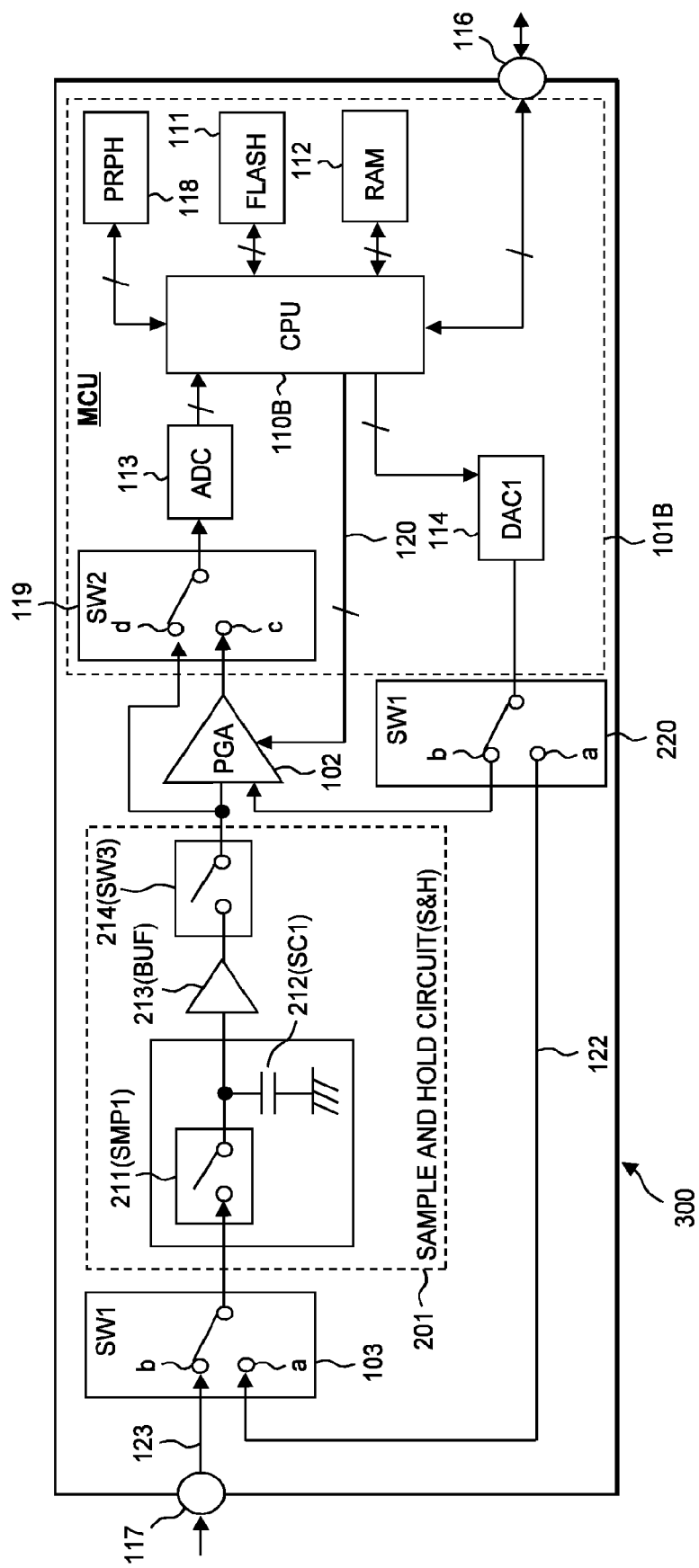
FIG. 21 is a block diagram illustrating a data processing system according to a fourth embodiment.

A data processing system according to a fourth embodiment is illustrated in FIG. 21. The data processing system 300 shown in the same drawing is different from the data processing system 100 of FIG. 1 in that a sample and hold circuit 201 is added as compared with the data processing system 100 of FIG. 1 and DA converters are aggregated into one DA converter (DAC1) 114 and that a CPU110B is adopted which enables the output of the DA converter 114 to be selectively supplied to a PAG102 or a selector 103 via a selector 220 and performs control according to it. That is, the data processing system 300 is provided with the sample and hold circuit 201 which samples and holds a setting analog signal 122 selectively instead of the measured analog signal 123 and outputs the same to the programmable gain amplifier 102, the DA converter (DAC1) 114 shared for the generation of an amp offset and the generation of the setting analog signal, and the selector 220 which selects a path for outputting an amp offset 121 generated by the DA converter 114 to the programmable gain amplifier 102 or a path for supplying a setting analog signal 122 generated by the DA converter to the sample and hold circuit 201. The CPU110B properly uses the DA converter 114 for the generation of the amp offset 121 and the generation of the setting analog signal 122 to perform selection control of the selector 220. The sample and hold circuit 201 is configured to include a sampling switch (SMP1) 211, a sampling capacitor (SC1) 212, an output buffer (BUF) 213 and an output selector switch (SW3) 214. The same components in other configurations as those in FIG. 1 are denoted by the same reference numerals, and the detailed description thereof will be omitted.

The setting of the amp offset and the generation of the setting analog signal can be performed in parallel where the DA converter 115 that outputs the amp offset 121 to the programmable gain amplifier 102 and the DA converter 114 that selectively outputs the setting analog signal 122 to the programmable gain amplifier 102 instead of the measured analog signal are separately provided as described in the first and second embodiments. It is therefore possible to contribute to an improvement in the processing efficiency at the time that a digital offset is obtained. On the other hand, as described in the fourth embodiment, when the DA converter 114 shared for the generation of the amp offset and the generation of the setting analog signal is adopted, the setting of the amp offset and the generation of the setting analog signal must be carried out in series form. It is however possible to contribute to a reduction in circuit scale by sharing of the DA converter.

Figure 22:
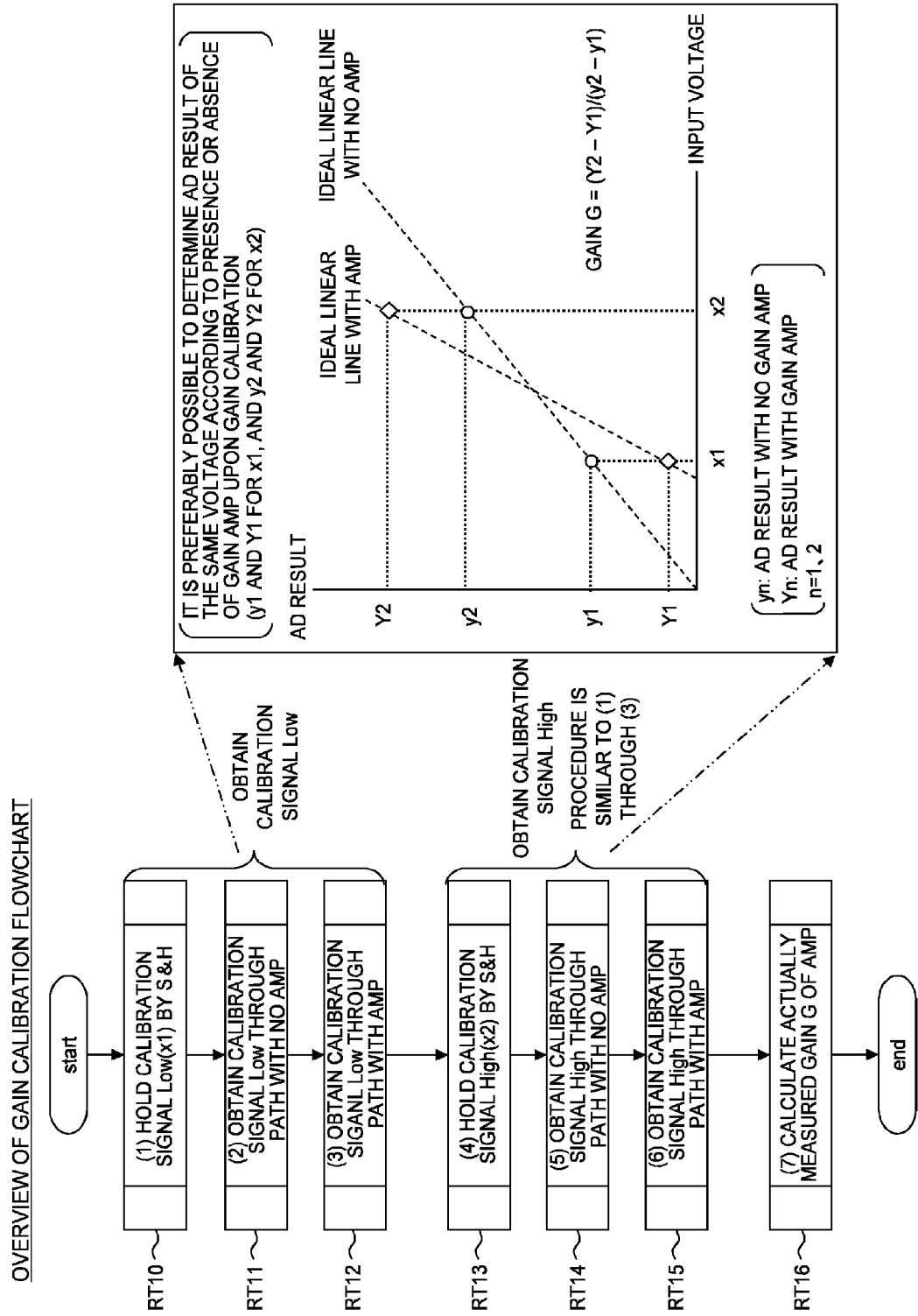
FIG. 22 is an explanatory diagram illustrating an overview of a gain calibration for a PGA in the case where DA converters are aggregated into one.

With the aggregation of the DA converters into one, processes RT10 through RT16 may sequentially be performed as shown in the overview of FIG. 22, for example with respect to the gain calibration for the PGA102. That is, in the actual gain acquisition process illustrated in FIG. 22, the terminal of the selector 103 is set to a, and the terminal of the selector 220 is set to g. Thus, an analog voltage x1 is output from the DA converter 114 to turn on the switch 211 (SMP1) built in the sample and hold circuit 201 and turn off the switch 214 (SW3) built therein, so that the voltage x1 is stored in the capacitor 212 (SC1) (RT10). After the storage of the voltage x1, the switch 211 is turned off and the switch 214 is turned on, and the selector 220 is set to f, whereby an arbitrary voltage 0 (e.g., 0V) is output from the DA converter 114 as an amp offset of the PGA102.

The terminal of the selector 119 is set to d and the AD converter 113 AD-converts the voltage x1 stored in the capacitor 212 through a path free of the PGA102 to thereby obtain an AD conversion result y1 (RT11). Next, the terminal of the selector 119 is set to c and the voltage x1 stored in the capacitor 212 is amplified by the PGA102, followed by its AD conversion by the AD converter 113 to thereby obtain an AD conversion result Y1 (RT12).

Likewise, an analog voltage x2 is output from the DA converter 114 and stored in the sample and hold circuit 201 (RT13). After the storage of the voltage x2, the switch 211 is turned off and the switch 214 is turned on, and the selector 220 is set to f. Thus, the amp offset voltage 0 is output from the DA converter 114.

A result y2 obtained by AD-converting the voltage x2 stored in the capacitor 212 by the AD converter 113 through the path free of the PGA102 is acquired (RT14). Next, the voltage x2 amplified by the PGA102 is AD-converted by the AD converter 113 to obtain an AD conversion result Y2 (TR15).

Finally the CPU110B computes actually measured gain G of the PGA102 from G=(Y2−Y1)/(y2−y1) to get the actually measured gain (RT16). Thus, the actually measured gain G is calculated from the ratio between the AD conversion result obtained via the path free of the PGA102 and the AD conversion result of the voltage amplified by the PGA102 with respect to the two voltages different from each other in this manner.

Incidentally, the processing is performed as x1<x2 in the above. The voltages of x1 and x2 are chosen arbitrarily within the range where the post-amplification voltage at the PGA102 does not exceed the input range of the AD converter.

Figure 23:
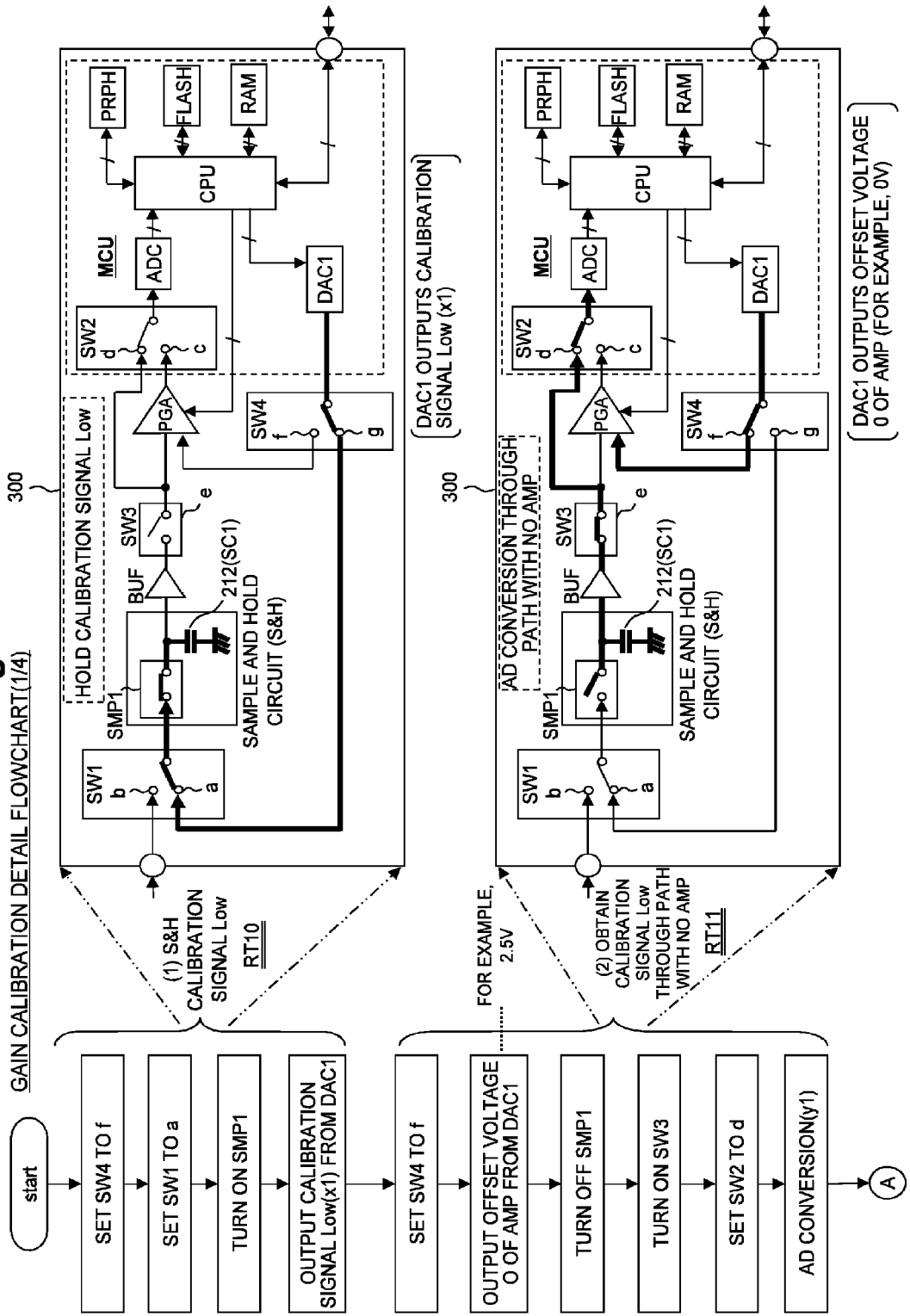
FIG. 23 is an operation explanatory diagram illustrating the details of processes RT10 and RT11 of FIG. 22.
Figure 24:
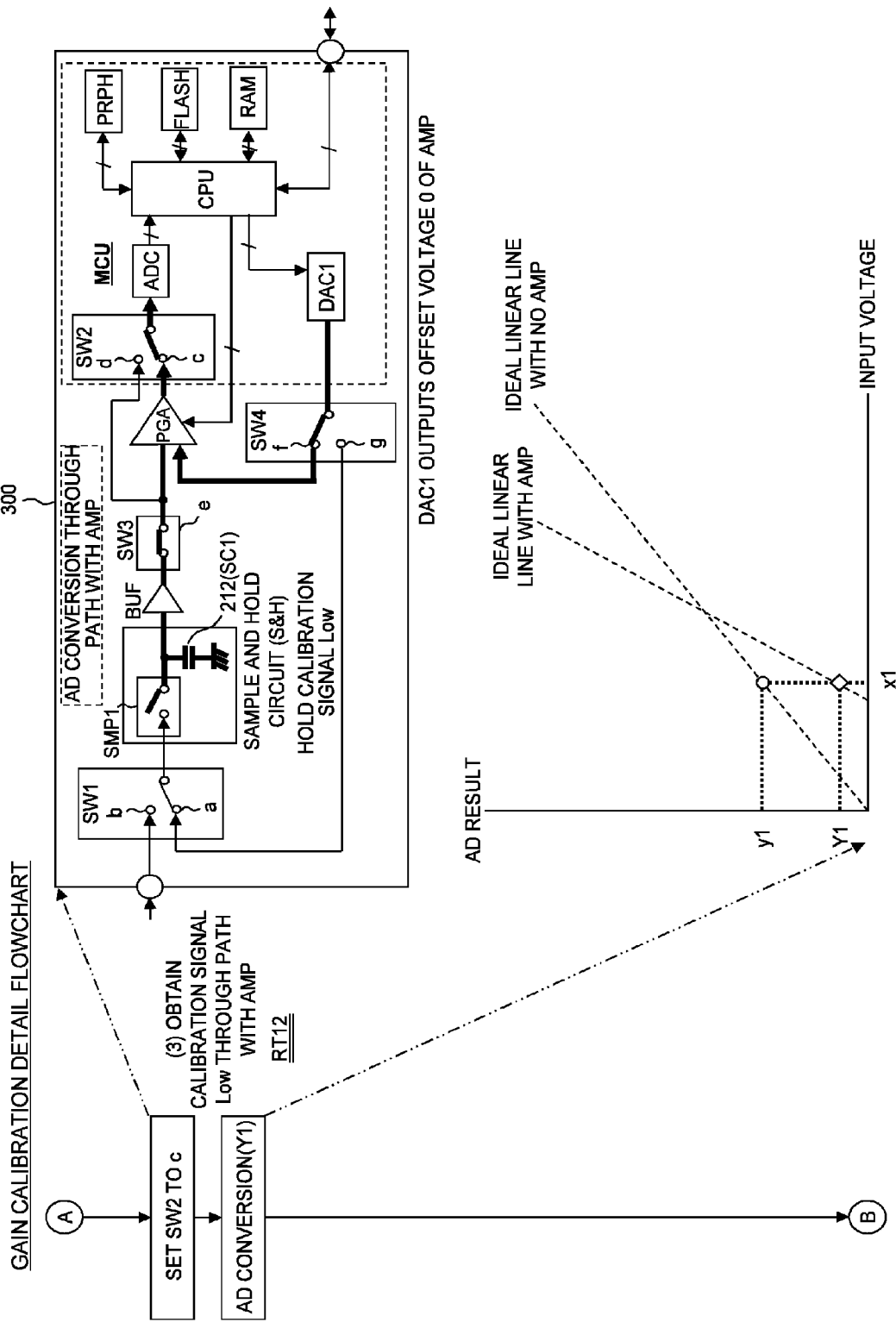
FIG. 24 is an operation explanatory diagram illustrating the details of a process RT12.
Figure 25:
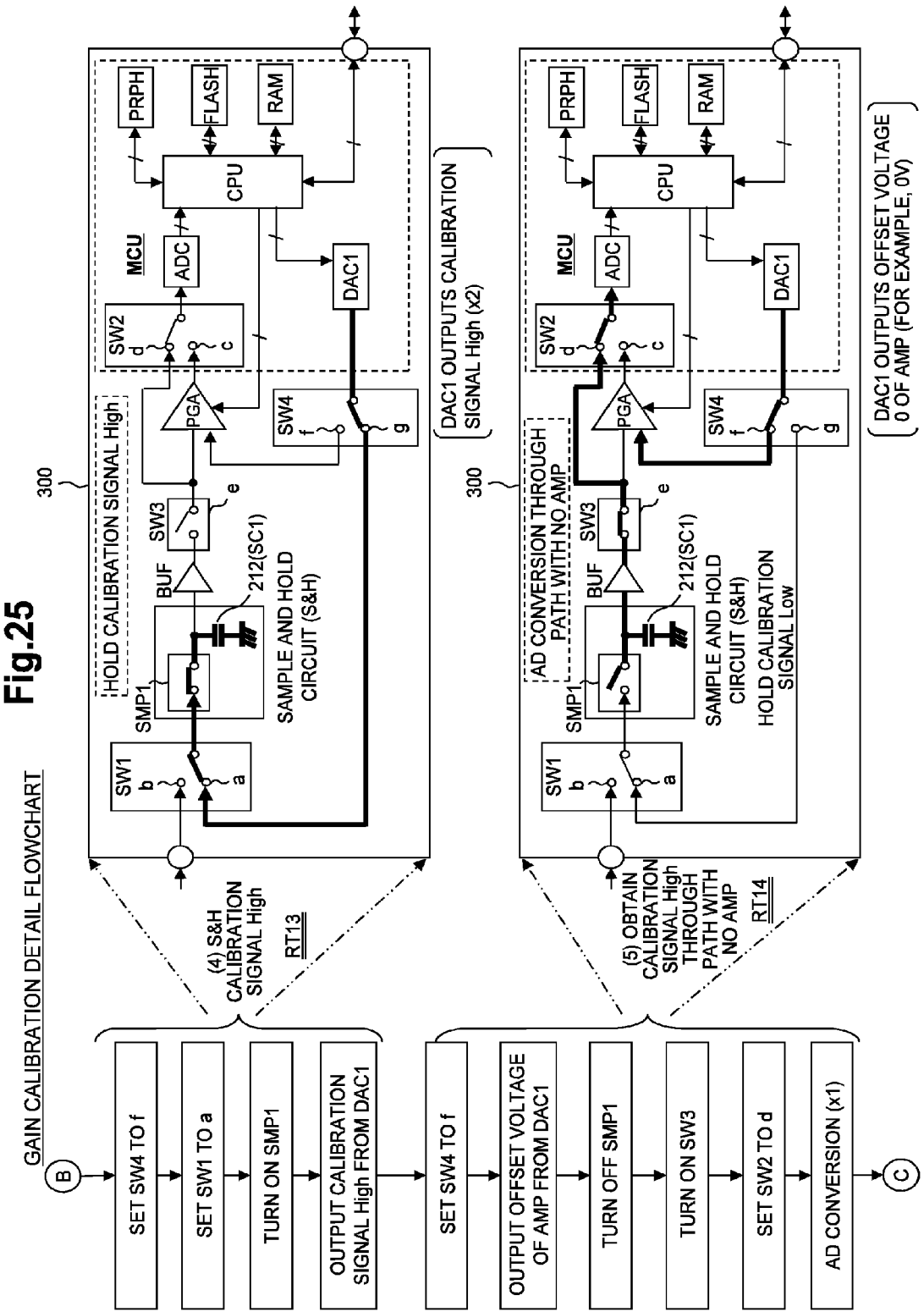
FIG. 25 is an operation explanatory diagram illustrating the details of processes RT13 and RT14.
Figure 26:
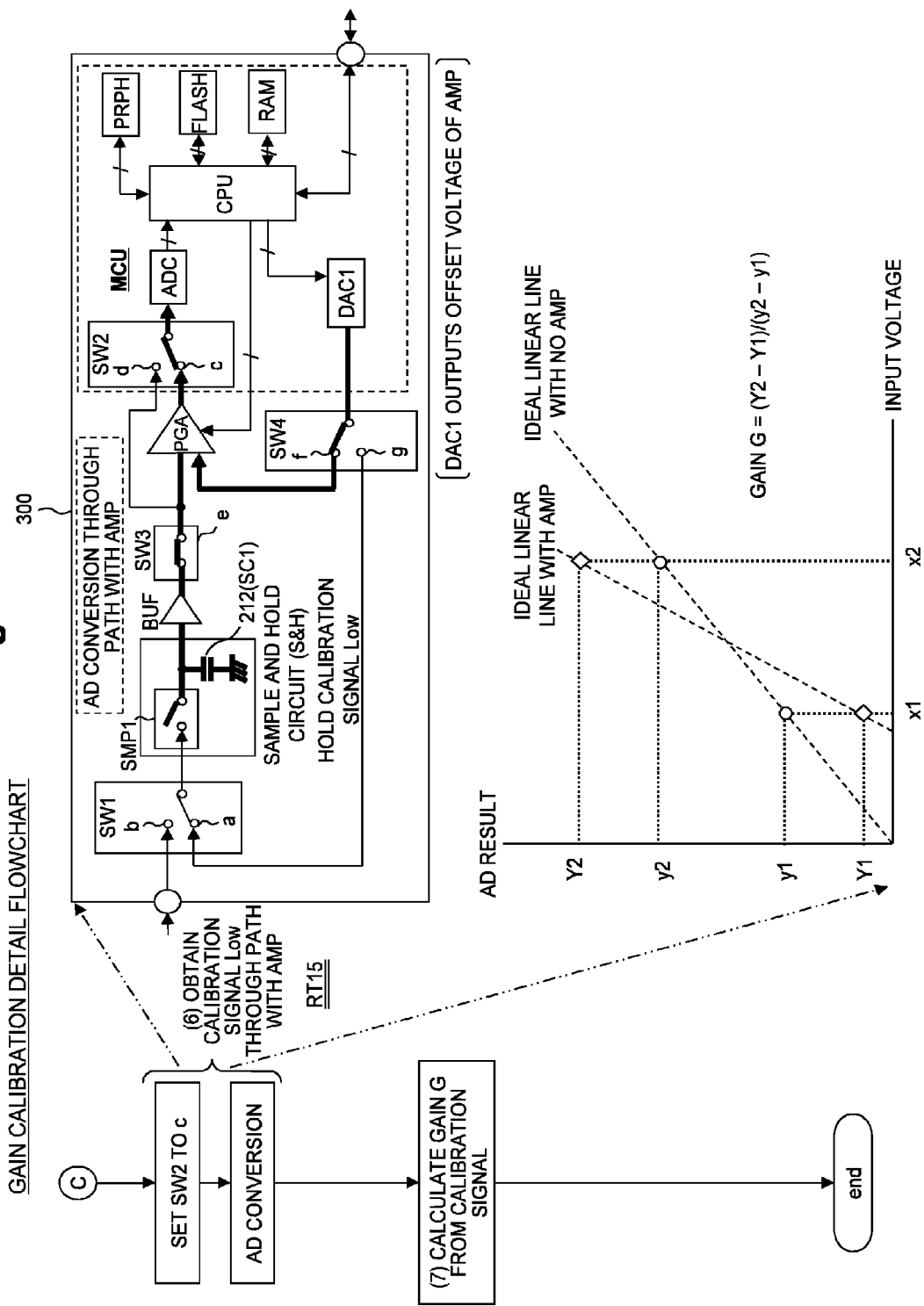
FIG. 26 is an operation explanatory diagram illustrating the details of a process RT15.
Figure 28:
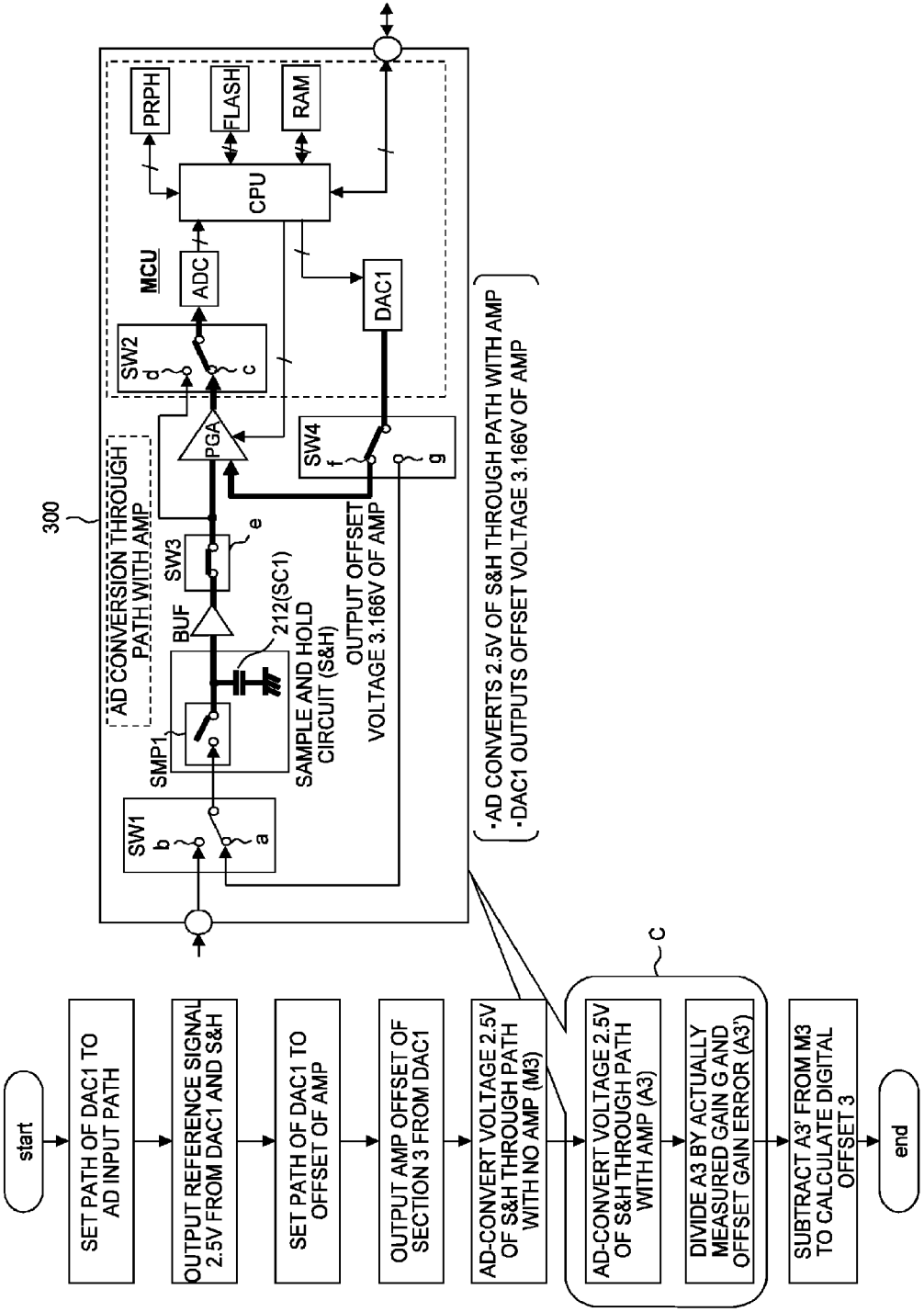
FIG. 28 is an operation explanatory diagram illustrating the details of a portion C in the flowchart at the calculation of the digital offset of the section 3.

The details of the processes RT10 and RT11 are exemplified in FIG. 23. The details of the process RT12 are exemplified in FIG. 24. The details of the processes RT13 and RT14 are exemplified in FIG. 25. The details the process RT15 are illustrated in FIG. 26. The details of portion A and B in the flowchart used upon the calculation of a digital offset of a section 3 are exemplified in FIG. 27, and the details of a portion C in the flowchart used upon the calculation of the digital offset of the section 3 are exemplified in FIG. 28. Although flows for the calculation of digital offsets of other sections are not shown in the figures, they may be generated by processes according to FIGS. 27 and 28.

The invention made by the present inventors above having been described in detail with reference to the exemplary embodiments, the present invention is not limited thereto. It is needless to say that various changes can be made thereto within the scope not departing from the gist of the invention.

For example, the process for the bit extension by the control unit like the microcomputer and the division by the actually measured gain may be performed not only by a fixed-point arithmetic operation but also by a floating point arithmetic operation. When basically doing the division after the execution of the bit extension as the order to perform the bit extension process for extending the bit precision and the division by the actually measured gain in the process of generating the digital offset and the like is desired in terms of an operational institution, it is necessary to do it in that order. However, if not so, then the order can also be reversed by a computation technique. The bit precision, extended number of bits and number of divisions of each section of the AD converter are not limited to the embodiments described above and may be changed as appropriate. The data processing system is not limited to a semiconductor device of one chip and can also be configured by a multichip. For example, it is also possible to configure the microcomputers (MCU) 101, 101A and 101B by one chip and configure other circuits by external components.

The above-described embodiments may also be configured in combination with one another.

INDUSTRIAL APPLICABILITY

The present invention relates to a data processing system having an AD conversion function and is widely applicable to a technique for obtaining a bit precision higher than the bit precision of an AD converter in particular.

EXPLANATION OF REFERENCE NUMERALS 100 data processing system
101 microcomputer (MCU)
102 programmable gain amplifier (PGA)
103 selector (SW1)
110 central processing unit (CPU)
111 non-volatile memory (FLASH)
112 RAM
113 AD converter (ADC)
114 first DA converter (DAC1)
115 second DA converter (DAC2)
116 digital input/output port
117 analog input port
118 peripheral circuit module (PRPH)
119 selector (SW2)
200 data processing system
201 sample and hold circuit
110A CPU
101A microcomputer
300 data processing system
110B CPU
101B microcomputer

What is claimed is:

1. In a data processing system comprising:
an AD converter;
a programmable gain amplifier; and
a control circuit,
a method for obtaining an AD conversion result in which a bit precision has been n-bit extended, the method comprising:
determining whether an analog signal to be measured belongs to any of divided ranges obtained by dividing an input range of the AD converter by m (where m: positive integer) by the control circuit;
setting an amp offset and target gain $2^n$ (where n: positive integer and $2^n \le m$) for expanding a voltage range for the determined divided range to a voltage range for the input range of the AD converter to the programmable gain amplifier by the control circuit;
converting an amplified signal of the measured analog signal by the programmable gain by the AD converter;
performing a bit extension of n bits for the converted data and a division of the extended data by actually measured gain of the programmable gain amplifier by the control circuit; and
adding digital offset data of the divided range to a result of division thereof by the control circuit, thereby obtaining the AD conversion result in which the bit precision has been n-bit extended.

2. The method according to claim 1,
wherein the data processing system further includes a first DA converter and a second DA converter,
wherein the control circuit controls:
a first process of acquiring first data by generating an arbitrary voltage of the specific divided range by the first DA converter and converting the same by the AD converter;
a second process of acquiring second data by performing a bit extension of n bits on the lower side of the first data;
a third process of acquiring third data by generating an arbitrary voltage of the specific divided range by the first DA converter and generating an amp offset for expanding the voltage range for the corresponding divided range to the voltage range for the input range of the AD converter by the second DA converter and by amplifying the arbitrary voltage generated by the first DA converter by the programmable gain amplifier to which the generated amp offset and the target gain $2^n$ have been set, and converting the amplified signal by the AD converter;

a fourth process of acquiring fourth data by n-bit extending the third data to the lower side and dividing the extended data by the actually measured gain; and a fifth process of acquiring digital offset data of the specific divided range by subtracting the fourth data from the second data.

3. The method according to claim 2, wherein when the digital offset data of the specific divided range is generated and thereafter digital offset data of the divided range of the upper side of the corresponding divided range is generated, the control circuit controls:

a sixth process of acquiring sixth data by generating the maximum voltage of the specific divided range by the first DA converter and generating by the second DA converter, an amp offset for expanding the voltage range for the corresponding divided range to the voltage range for the input range of the AD converter, and by amplifying the maximum voltage generated by the first DA converter by the programmable gain amplifier to which the generated amp offset and the target gain $2^n$ have been set, and converting the amplified signal by the AD converter;

a seventh process of acquiring seventh data by n-bit extending the sixth data to the lower side and dividing the extended data by the actually measured gain, and adding the digital offset data to a result of division thereof;

an eighth process of acquiring eighth data by generating the minimum voltage of the upper divided range by the first DA converter and generating by the second DA converter, an amp offset for expanding the voltage range for the corresponding divided range to the voltage range for the input range of the AD converter, and by amplifying the minimum voltage generated by the first DA converter by the programmable gain amplifier to which the generated amp offset and the target gain $2^n$ have been set, and converting the amplified signal by the AD converter; and a ninth process of n-bit extending the eighth data to the lower side and dividing the extended data by the actually measured gain, and subtracting a result of division thereof from the seventh data to define the resultant data as digital offset data of the upper divided range.

4. The method according to claim 2, wherein when the digital offset data of the specific divided range is generated and thereafter digital offset data of the divided range of the lower side of the corresponding divided range is generated, the control circuit controls:

a tenth process of acquiring tenth data by generating the minimum voltage of the specific divided range by the first DA converter and generating by the second DA converter, an amp offset for expanding the voltage range for the corresponding divided range to the voltage range for the input range of the AD converter, and by amplifying the minimum voltage generated by the first DA converter by the programmable gain amplifier to which the generated amp offset and the target gain $2^n$ have been set, and converting the amplified signal by the AD converter;

an eleventh process of acquiring eleventh data by n-bit extending the tenth data to the lower side, dividing the extended data by the actually measured gain, and adding the digital offset data to a result of division thereof;

a twelfth process of acquiring twelfth data by generating the maximum voltage of the divided range of the lower side by the first DA converter and generating by the second DA converter, an amp offset for expanding the voltage range for the corresponding divided range to the voltage range for the input range of the AD converter, and by amplifying the maximum voltage generated by the first DA converter by the programmable gain amplifier to which the generated amp offset and ideal gain $2^n$ have been set, and converting the amplified signal by the AD converter; and a thirteenth process of n-bit extending the twelfth data to the lower side, dividing the extended data by the actually measured gain, and subtracting a result of division thereof from the eleventh data to define the resultant data as the digital offset data of the lower divided range.

5. The method according to claim 1, wherein the control circuit sets the amp offset so as to cross boundary portions between the adjacent divided ranges.

6. The method according to claim 1, wherein the data processing system further includes a sample and hold circuit which inputs the measured analog signal therein, wherein the control circuit performs, using the same measured analog signal sampled by the sample and hold circuit, determination as to each divided range and AD conversion that defines the voltage range for the determined divided range as the voltage range for the input range of the AD converter.

7. The method according to claim 1, wherein the control circuit performs the process for AD conversion by setting the number of divisions of the input range of the AD converter to an odd number when the central value of the measured analog signal is close to the central value of the input range of the AD converter.

8. The method according to claim 1, wherein the data processing system further includes separately, a DA converter which outputs the amp offset to the programmable gain amplifier and a DA converter which selectively outputs a setting analog signal to the programmable gain amplifier.

9. The method according to claim 1, wherein the data processing system further includes:

a sample and hold circuit which selectively samples and holds a setting analog signal instead of the measured analog signal and outputs the same to the programmable gain amplifier, a DA converter shared for the generation of the amp offset and the generation of the setting analog signal, and a selection circuit which selects a path to output the amp offset generated by the DA converter to the programmable gain amplifier or a path to supply the setting analog signal generated by the DA converter to the sample and hold circuit.

* * * * *